(12) United States Patent
Docker

(10) Patent No.: US 6,463,557 B1
(45) Date of Patent: Oct. 8, 2002

(54) WEAK BIT TESTING

(75) Inventor: Steven Charles Docker, Worcestershire (GB)

(73) Assignee: STMicroelectronics Limited, Almondsbury Bristol (GB)

( * ) Notice: Subject to any disclaimer, the term of this patent is extended or adjusted under 35 U.S.C. 154(b) by 0 days.

(21) Appl. No.: 09/285,168

(22) Filed: Mar. 30, 1999

(30) Foreign Application Priority Data

Mar. 31, 1998 (GB) ............................................ 9806951

(51) Int. Cl.$^7$ ............................................ G11C 29/00
(52) U.S. Cl. .................... 714/719; 365/189.01; 365/201
(58) Field of Search ................. 324/763, 765, 324/522, 523, 73.1; 714/719; 365/200–201, 189.01, 154, 155, 189.06, 226, 230.05, 189.1, 145; 327/210, 212, 58; 257/369, 392, 217; 438/149, 238

(56) References Cited

U.S. PATENT DOCUMENTS

| | | | | |
|---|---|---|---|---|
| 4,719,418 | * | 1/1988 | Flaker et al. | 365/201 |
| 5,034,923 | * | 7/1991 | Kuo et al. | 365/189.01 |
| 5,255,230 | * | 10/1993 | Chan et al. | 365/201 |
| 5,519,712 | * | 5/1996 | Shu et al. | 365/201 |
| 5,969,998 | * | 10/1999 | Oowaki et al. | 365/149 |
| 6,118,713 | * | 9/2000 | Raad | 365/201 |
| 6,177,300 | * | 1/2001 | Houston et al. | 438/149 |
| 6,272,588 | * | 8/2001 | Johnston et al. | 711/106 |

OTHER PUBLICATIONS

Voldman (TLM: a trench leakage monitor for a four megabit SPT DRAM technology; IEEE, Aug. 1991).*
Nishihara, T. et al. (Data retention in ultra–thin–film–SOI DRAM with buried capacitor cell; IEEE, Jun. 7–9, 1994).*
Standard Search Report from the European Patent Office dated Feb. 22, 1999.
Anne Meixner, et al., Weak Write Test Mode: An SRAM Cell Stability Design for Test Technique, IEEE Comp. Soc., IEEE Catalog No. 96CM35976, ISBN 0–7803–3541, 1996, pp. 309–318.

* cited by examiner

Primary Examiner—Albert Decady
Assistant Examiner—Guy Lamarre
(74) Attorney, Agent, or Firm—Wolf, Greenfield & Sacks, P.C.; James H. Morris; Robert A. Skrivanek, Jr.

(57) ABSTRACT

A method for testing a semiconductor memory cell comprising first and second transistors in cross-coupled arrangement to form a bistable latch, the drains of the transistors respectively representing first and second nodes each for storing a high or low potential state, and each node being connected to a respective semiconductor arrangement for replacing charge leaked from the node and to a respective switching means, activatable by a word-line, for coupling the node to a respective bit-line, the method comprising the steps of: connecting the bit-lines to the low potential; activating the word-line to connect the first node to the first bit-line to allow any potential on the first node to fall towards the potential on the first bit-line; and monitoring charge flow from the first node to the first bit-line to test the operation of the first semiconductor arrangement.

21 Claims, 27 Drawing Sheets

| FIG. 12A |
| FIG. 12B |
| FIG. 12C |

WEAK BIT TESTING

BACKGROUND OF THE INVENTION

The present invention relates to the testing of a semiconductor memory device, more specifically to a method for testing for the presence and correct working of charge-replacing circuitry commonly found in semiconductor memory cells.

A large number of memory cells used in modern semiconductor memory arrays include pairs of transistors, cross-coupled to form bistable latches, as illustrated in FIG. 1. Such memory cells have two nodes, N1 and N2, represented by the drains of the respective transistors, hereafter referred to as storage transistors. By selectively coupling each node to a respective bit-line ("bit", "notbit") and then taking one bit-line high and the other low, potentials can be stored on each of the nodes. More specifically, the first bit-line "bit" connected to the first node N1 may be taken high, thus taking the first node high, whilst the second bit-line "notbit", connected to the second node N2 is taken low, thus taking the second node low. It should be noted that for a bistable circuit to be in a stable state, the value stored on one node must be the logical opposite of that stored on the other node. An identical value on each node represents an unstable state and such instances only occur temporarily during certain reading or testing procedures, as described hereinbelow.

In the following description, the convention is adopted wherein the value stored by the cell is taken to be the value stored on the first node N1. For example, if the cell has a high (sometimes referred to as a '1') stored on the first node N1, and therefore a low (sometimes referred to as a '0') stored on the second node N2, the cell may be taken to be storing a high. Using the opposite convention the same cell would be deemed to be storing a low.

If the nodes are subsequently disconnected from the bit-lines, the bistable latch circuit would ideally retain its state indefinitely. However, charge from the node storing the high may leak through the respective storage transistor to ground. This may be caused by defects in the manufacturing process used to make the circuits or may be the unavoidable result of the way that the physics of manufacturing work. A common mode of leakage, other than a manufacturing defect, is charge leakage directly from the node to the ground terminal. This is due to the fact that the NMOS transistors commonly used in circuits of this type have sources and drains comprising N-type silicon which is fabricated in a P-type substrate. The NMOS sources and drains thus form P-N diodes with the substrate which are reverse biased during normal operation. These reverse biased diodes pass a small amount of current called "leakage current". Should this occur, the cell will retain its contents for a period of milliseconds or seconds but then lose its state. The faulty cell is then termed a weak bit.

To ensure that the contents of the cell will not be lost if the cell is left for a long period of time, circuitry for replacing any charge lost due to leakage is normally incorporated into the cell. Circuitry is connected between a positive voltage supply and each node of the memory cell. As charge leaks from the node, it is replaced by charge flowing through the charge-replacing circuitry (hereafter identified as CRC) from the positive voltage supply.

FIG. 1 shows a basic memory cell having no CRC. Because of charge leakage, such a cell will have no ability to retain its state for a long period of time once it is isolated from the bit-lines. The cell consists of four transistors, M1, M2, M4 and M6. M4 and M6 are the storage transistors and form the main body of the cell. Both have their sources connected to ground, and their gates and drains are cross coupled to form a bistable latch, with the drain of one connected to the gate of the other and vice versa. Nodes N1 and N2 are connected, respectively, to bit-lines "bit" and "notbit" via access transistors M1 and M2. Transistors M1 and M2 have the function of coupling, respectively, nodes N1 and N2 to bit-lines "bit" and "notbit" in response to an activating signal on word-line 10. When the activating signal on word-line 10 is low, access transistors M1 and M2 are turned off, isolating the cell from bit-lines "bit" and "notbit".

FIG. 2 shows a memory cell similar to that shown in FIG. 1, but which includes CRC for replacing charge lost due to leakage. This is a 6 transistor static RAM cell. In this diagram, the main body of the cell consists of four transistors, M3–M6. Transistor M4 has its drain connected to the gate of transistors M5 and M6 and to the drain of M3. Similarly, transistor M6 has its drain connected to the gate of transistors M3 and M4 and the drain of transistor M5. As before, nodes N1 and N2 corresponding, respectively, to the drains of transistors M4 and M6 are coupled to bit-lines "bit" and "notbit" respectively via access transistors M1 and M2 which are activated in response to a signal on word-line 10. M3 and M4 form an inverter, as do M5 and M6. The inverters are cross-coupled so that the output of one inverter is the input of the other, forming a bistable latch. When the cell is isolated from the bit-lines "bit" and "notbit", by turning off M1 and M2, the main body of the cell will actively retain its state. Because the cell has active feedback through the inverters in the cell, any charge lost from N1 or N2 will be replaced by the CRC connected to that node.

FIG. 3 shows a similar cell to that shown in FIG. 2, but having CRC implemented as a high value resistance in series with the storage transistors. This is known as a 4 transistor static RAM cell. In the circuit shown in FIG. 3, the high value resistance takes the form of a pair of semiconductor diodes connected to each node. These diodes are connected in back-to-back arrangement, that is to say one diode is forward biased with respect to the voltage supply while the other is reverse biased with respect to the voltage supply. Thus the current passed by the diode pair is limited to the reverse saturation current of the reverse biased diode. This current is usually sufficient to replenish any charge lost due to leakage. However, the reverse biased diodes represent an effective resistance of tera-ohms to giga-ohms. Thus, the current passed by them is very small and if the charge leakage from the cell is relatively high, such a current may not be great enough to counteract the leaking charge. Furthermore, the circuit shown in FIG. 3 has the drawback that a pair of diode loads must be added to the cell, adding extra cost and complexity to the manufacturing process. Therefore, it is more common for the circuit of FIG. 2 to be used.

Often a cell is combined with many other cells to form an array comprising a plurality of columns of such cells and a plurality of rows of such cells. In an array, the cells in a column are connected via common bit-lines to allow reading and writing. The cells in a row are connected via common word-lines. The use of a cell with no CRC would cause the memory cells to fail unless a refresh circuit were coupled to counteract the effect of charge leakage every few milliseconds. This is not a practical solution. Incorporating CRC in one form or another thus provides a convenient way of ensuring that memory cells retain their state for a long period of time.

It is useful to be able to determine if the elements of the cell are functioning correctly. One test to achieve this is called the Marinescu 17N test and involves writing patterns of '0's and '1's into the cell and then reading them back and verifying them. The write part of the procedure is accomplished as outlined hereinabove, but the read part of the procedure is carried out as follows. The cell is isolated by turning off the word-line. The bit-lines are then charged to the supply voltage and the word-line is turned back on, reconnecting the bit-lines to the nodes. Charge will flow from the bit-line, through the node storing a low, through its respective storage transistor to ground. The potential on this bit-line will thus fall creating a potential difference between it and the other bit-line which will increase with time. This potential difference can be amplified by a sense amplifier and the contents of the cell can be verified. The potential on the other bit-line should not decrease with time since it is at the same potential as its respective node and thus no charge may flow through its respective access transistor. This procedure verifies the presence and correct working of the access transistors and the storage transistors, since if any are missing, the cell will be unable to store either a '1'or a '0'correctly. However, this test does not, by necessity, verify the presence and correct working of the CRC. It is important that this be done, since it is the CRC which ensures that the internal state of the cell is not lost if the cell is not accessed for a long period of time. It should be noted that if a cell with no CRC is accessed before the internal state is lost, the very act of connecting the nodes to the bit-lines in a read operation will refresh any state in the cell which has been degraded. If a cell with CRC is used, such as the cell shown in FIG. 2, and the CRC is compromised in some way, the cell reverts, either wholly, or in part, to the form of FIG. 1 and is known as a weak bit or, alternatively, as a cell with a data retention fault. There are two types of weak bit faults: symmetric faults, wherein the CRC on both sides of the cell fail, and asymmetric faults, wherein the CRC on only one side of the cell fails.

One test for the presence and correct functioning of the CRC is similar to the Marinescu 17N test described previously. A data pattern is written into the memory cells and then, after a long period of time, the data is read out and any discrepancies in the values of the cells are looked for. The inverse pattern is then written into the cells and the process is repeated. However, this test has a disadvantage in that a long period of time is needed to wait for any leakage effects to degrade the cell to the point where it loses its state. Since leakage is highly temperature and voltage dependent, this could take anything from between milliseconds to seconds. The total test time allocated to the testing of a typical semiconductor memory is normally approximately 2 to 3 milliseconds. The above test, however, may take several seconds to complete. Waiting for such a period of time to run only a data retention test far exceeds the budgeted test time by many orders of magnitude, thus slowing down production and increasing costs.

An alternative approach is to implement a test using a circuit called a controlled word-line driver (see Weak Write Test Mode: an SRAM Cell Stability Design for Test Technique, Anne Meixner and Jash Banik, 1996 International Test Conference Proceedings, IEEE Computer Society, IEEE Catalog No. 96CH35976, pp309–318). In this test, a voltage at an intermediate value between the ground potential and the supply potential is forced on to one of the nodes. This can be achieved by controlling the voltage level on the word-line. If the word-line is placed, for example, at half the voltage supply potential, then the voltage driven on to the node storing a high is the lower of the bit-line voltage or the voltage on the word-line minus the threshold voltage of the access transistor. When the word-line is turned off, the side of the cell storing a high will either remain at its current value because the CRC is missing or, if the CRC is working correctly, will be restored to the power supply voltage. Since the cell will have been sensitised so that it is closer to failing, the period of time needed to wait before data loss occurs is reduced. However, the implementation of such a test has disadvantages in that a separate power supply voltage is needed solely for the circuit which drives the word-line (the word-line driver). It also requires careful characterisation to determine what the best value of the word-line voltage should be to make the test successful. Also, an indeterminate period of time is still needed for leakage to occur.

It would be advantageous to have a method for testing for the presence and correct working of the CRC which does not require circuitry to be added to the cell other than that shown in FIGS. 2 or 3, and which can be carried out in a greatly reduced period of time. The present invention is aimed at addressing this problem.

SUMMARY OF THE INVENTION

According to one aspect of the present invention, therefore, there is provided a method for testing a semiconductor memory cell comprising first and second transistors in cross-coupled arrangement to form a bistable latch, the drains of the transistors respectively representing first and second nodes each for storing a high or low potential state, and each node being connected to a respective semiconductor arrangement for replacing charge leaked from the node and to a respective switching means, activatable by a word-line, for coupling the node to a respective bit-line, the method comprising the steps of: connecting the bit-lines to the low potential; activating the word-line to connect the first node to the first bit-line to allow any potential on the first node to fall towards the potential on the first bit-line; and monitoring charge flow from the first node to the first bit-line to test the operation of the first semiconductor arrangement.

Furthermore, according to another aspect of the present invention, there is provided apparatus for testing a semiconductor memory cell comprising first and second transistors in cross-coupled arrangement to form a bistable latch, the drains of the transistors respectively representing first and second nodes each for storing a high or low potential state, and each node being connected to a respective semiconductor arrangement for replacing charge leaked from the node and to a respective switching means, activatable by a word-line, for coupling the node to a respective bit-line, the apparatus comprising: switching circuitry for connecting both bit-lines to the low potential; and testing circuitry connected to the first bit-line for monitoring charge flow from the first node to the first bit-line.

Preferably, the first semiconductor arrangement is deemed to be functioning if the flow of current from the first node to the first bit-line reaches a predetermined level or if the potential of the first bit-line reaches a predetermined level within a predetermined period of time.

Preferably, the first semiconductor arrangement is deemed not to be functioning if the flow of current from the first node to the first bit-line does not reach a predetermined level or if the potential of the first bit-line does not reach a predetermined level within a predetermined period of time.

The predetermined period of time is suitably in the range from 10 to 100 ns, preferably in the range from 30 to 70 ns and most preferably around 50 ns from connection of the bit line to the node.

Preferably, the first semiconductor arrangement comprises a PMOS transistor.

Alternatively, the first semiconductor arrangement may comprise a pair of diodes.

Preferably the switching means comprises one or more transistors.

The testing circuitry may comprise a threshold circuit.

Preferably, the potential of the first bit-line is measured by a threshold circuit.

The threshold circuit may be provided by an inverter.

The threshold circuit may be set to switch when the potential of the bit line rises to between 10% and 80% of the said higher potential, preferably between 30% and 60%, most preferably around 50%. The potential at which the threshold circuit is set to switch may be at the threshold for a high logic level in the system, or may be lower than that threshold. The testing circuitry may comprise an amplifier for amplifying charge flow from a bit line.

Preferably, the switching circuitry for connecting the bit-lines to a low potential comprises a plurality of logic gates and/or a plurality of transistors.

The memory cell is preferably a 6 transistor static RAM cell.

Alternatively, the cell may be a 4 transistor static RAM cell.

The cell is preferably formed on an integrated circuit. The integrated circuit preferably comprises a plurality of cells, suitably connected in an array by common bit and word lines.

The integrated circuit preferably also comprises the testing circuitry and/or means for connecting both bit lines of the cell to a low potential at the same time.

A method according to the invention may also comprise testing the first semiconductor arrangement as described above and then, in an analogous way testing the second semiconductor arrangement.

Where the cell is one of several on an integrated circuit the method may comprise testing semiconductor arrangements of all those cells. More than one cell of such a circuit may be tested simultaneously. It is envisaged that 32, 64 or 128 cells may be tested simultaneously in parallel.

BRIEF DESCRIPTION OF THE DRAWINGS

The invention will now be described, by way of example only, with reference to the accompanying drawings in which.

DERAILED DESCRIPTION OF THE PREFERRED EMBODIMENT

Figure 1:
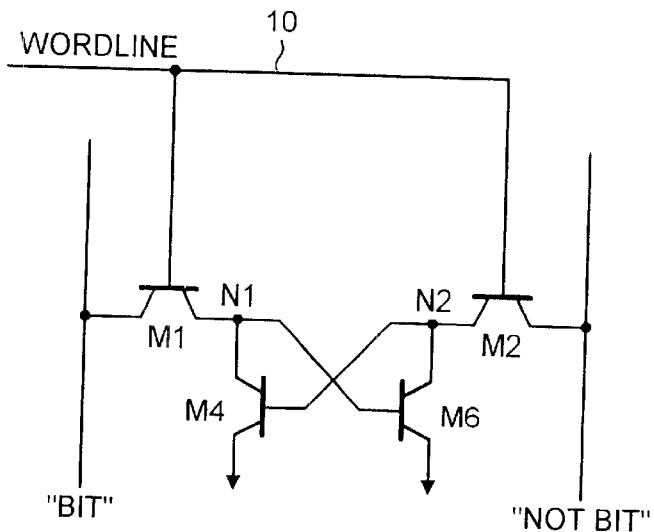
FIG. 1 shows a basic four-transistor memory cell having no CRC.
Figure 2:
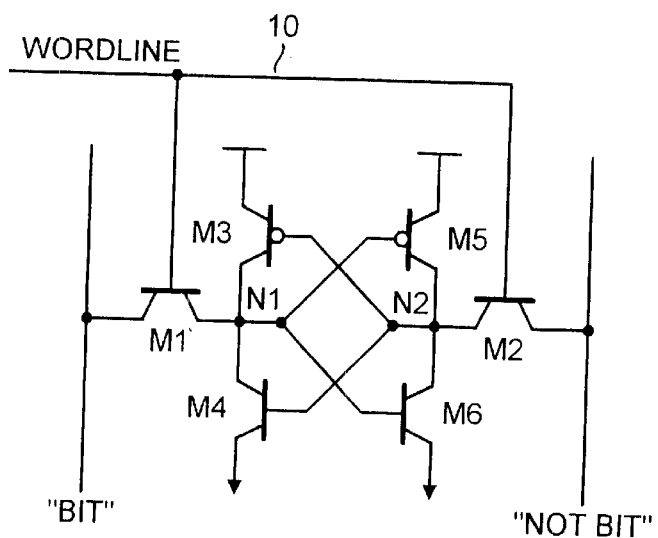
FIG. 2 shows a similar four-transistor memory cell having CRC in the form of transistors.
Figure 3:
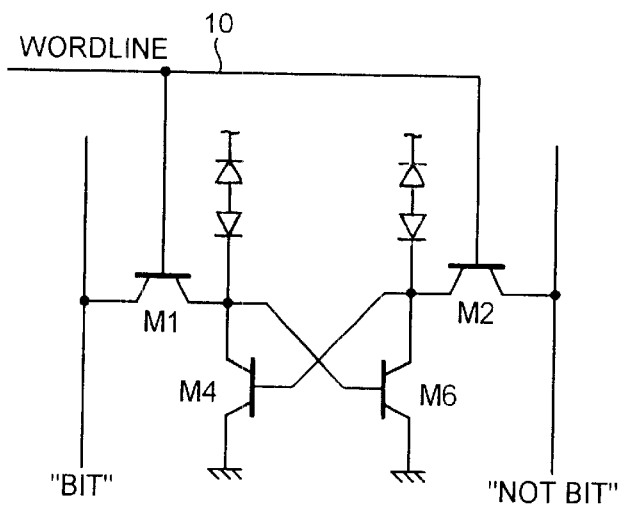
FIG. 3 shows a similar four-transistor memory cell having CRC in the form of high value resistance.

This test alms to find whether the CRC is present and working correctly. Generally, before the test commences, the cell will be storing a value; that is to say that (referring to FIG. 2) nodes N1 and N2 will be at logically opposite potentials. This is achieved in the conventional manner by taking one bit-line high and the other bit-line low and then turning on the word-line to connect the bit-lines to the nodes. In this case, the PMOS transistor connected to the node storing a high will be on while that connected to the node storing a low will be off. (It is possible for the cell not to be storing a value, with both nodes low). Once a value has been written, the word-line is deactivated and, if the CRC is present and functioning correctly, the cell retains its state. It should be noted, however, that the contents of the cell prior to the commencing of the test are irrelevant.

Figure 4:
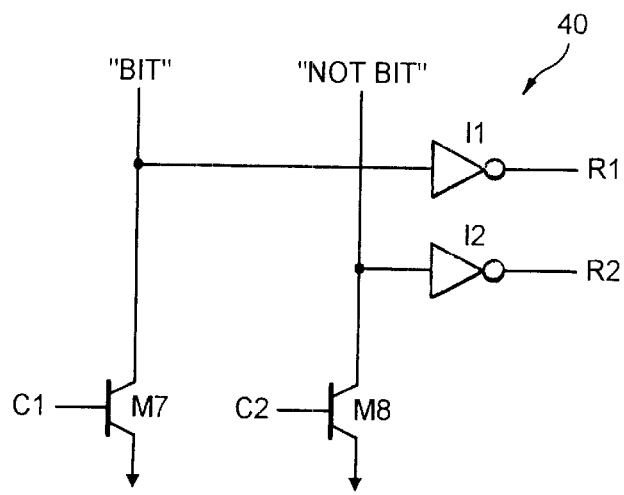
FIG. 4 shows testing circuitry for monitoring the flow of charge from the node to the bit-line.

The bit-lines are firstly coupled to a low potential via transistors M7 and M8 (FIG. 4). The word-line 10 is then activated, turning on access transistors M1 and M2 and reconnecting the nodes, one storing a high and the other storing a low, to the bit-lines which are both held low.

When this occurs, there is no change in the state of the node storing a low since the bit-line is also at a low. However, on the other side of the cell, charge will start to flow from the node storing a high, through its respective access transistor and on to the bit-line. The potential on this node consequently falls towards a value near to the low potential of the bit-line. The drop in potential on this node causes the PMOS transistor to the other node to turn on. Thus, both PMOS transistors M3 and M5 are on. It can be seen that, as stated above, the contents of the cell prior to the commencing of the test is irrelevant since the connecting of the nodes to the bit-lines which are held at a low potential erases any prior cell contents.

If the CRC on this side of the cell is not working correctly, the charge flow from the node on to the bit-line will fall to zero almost instantaneously and will not rise. However, if the respective CRC is functioning correctly, charge supplied from the voltage supply through the CRC will continue to flow from the node on to the bit-line. By monitoring this charge flow from the node on to the bit-line, it is possible to establish if the CRC is working correctly.

In a preferred embodiment, the method of monitoring this charge flow is achieved by measuring the maximum instantaneous value of the current flowing from the node on to the bit-line. If the value of the current reaches a predetermined level, the CRC is deemed to be working correctly. If the value of the current does not reach the predetermined level, the CRC is deemed not to be working correctly.

This embodiment also makes it possible to grade the functionality of the CRC in that the higher the value of current, the greater is the degree of functionality of the CRC. Partially functioning CRCs may be acceptable for some applications but not for others.

In another preferred embodiment, the method of monitoring this charge flow is achieved by disconnecting one of the bit-lines from the low potential and allowing it to 'float', i.e. allowing it to be influenced by the CRC in the memory cell. Thereafter the potential on the disconnected bit-line is measured. If the CRC is present, the potential on the bit-line will rise. Furthermore, the potential on the bit-line will rise at a rate dependent on how well the CRC is working, thus making it possible to grade the functionality of the CRC. In this instance, timing circuitry can be employed to determine the time taken for the potential on the disconnected bit-line to rise to the predetermined level. If the potential on the bit-line reaches the predetermined level within a predetermined period of time, the CRC is deemed to be fully working. If the potential on the bit-line does not reach the predetermined level within the predetermined period of time, the CRC is deemed not to be fully working and the time taken for the predetermined level to be reached indicates the extent of the failure of the CRC. If the potential on the bit-line does not reach the predetermined level after any length of time, the CRC is deemed to have failed completely.

To determine the predetermined potential level described above, threshold circuitry (40) can be employed which can take the form of the circuitry illustrated in FIG. 4. Each bit-line "bit" and "notbit" has connected to it a low-threshold inverter, or a Schmitt trigger, I1 and I2 respectively, which is switched on when the voltage on its bit-line reaches its threshold level. The outputs, R1 and R2, connected to I1 and I2 respectively, are high while the voltage on their respective bit-lines is low. However, once the threshold voltage of either I1 or I2 has been reached on a bit-line, the inverter connected to that bit-line changes state, thus forcing its respective output, R1 or R2, low. The timing circuitry can be connected to R1 or R2 to measure the time taken for the output to switch low after release of the bit-line.

Figure 5A:
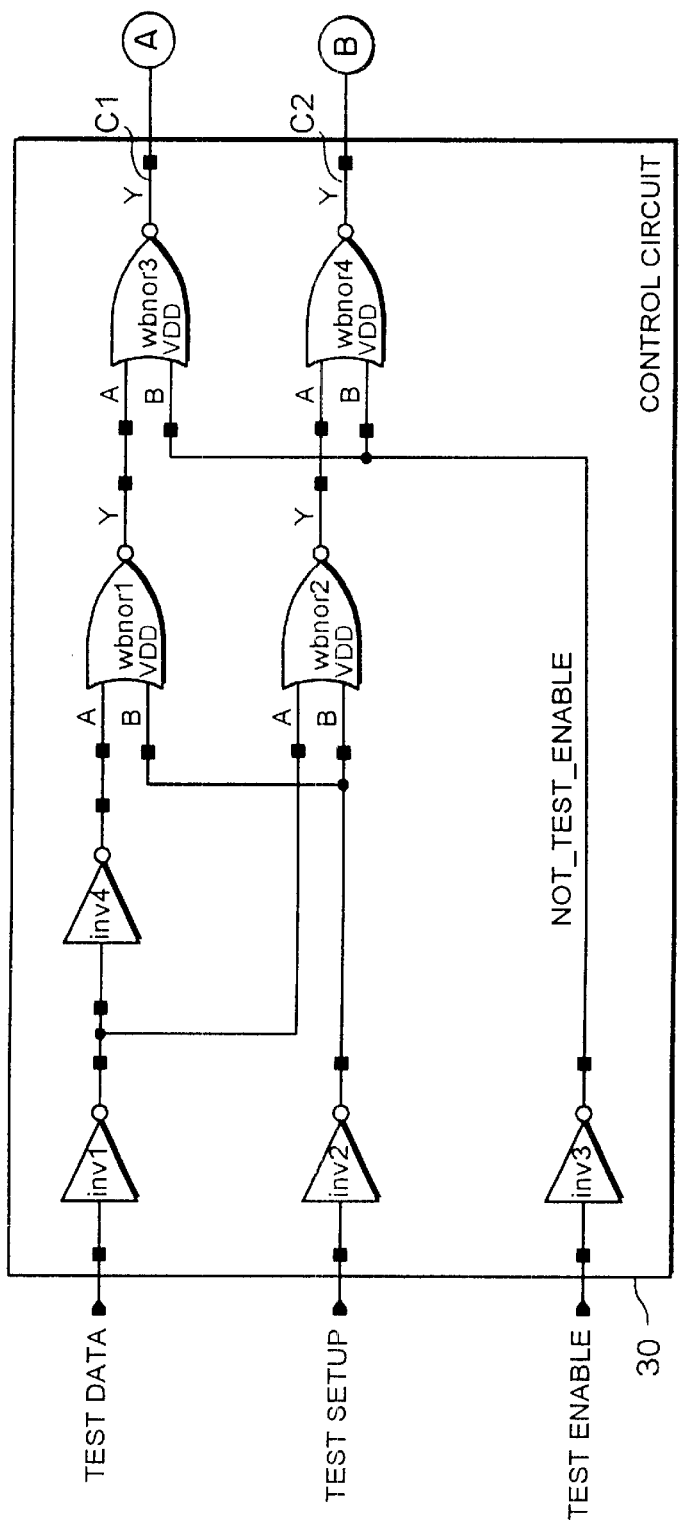
FIG. 5 shows switching circuitry for coupling each bit-line to a predetermined low potential.
Figure 5B:
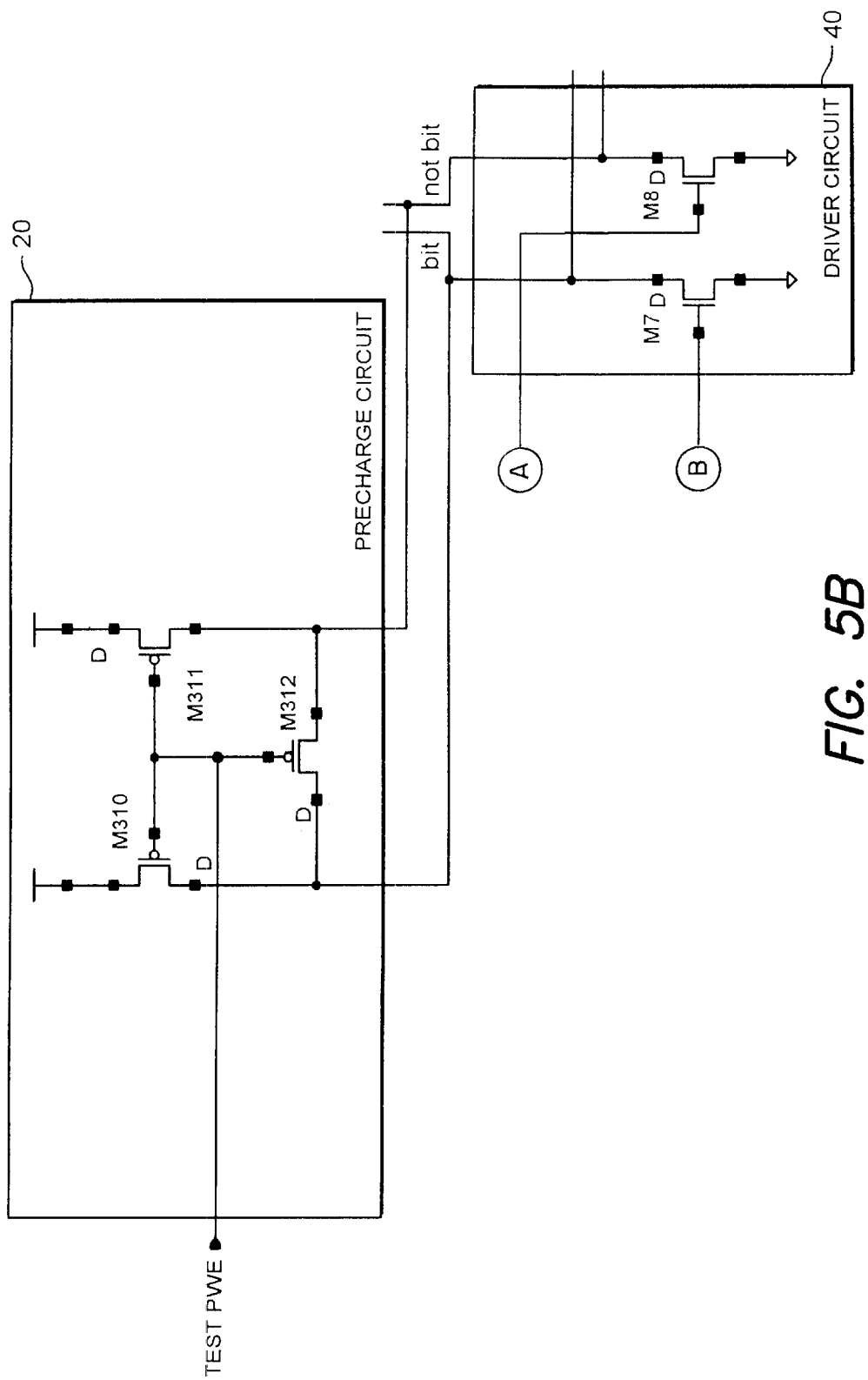

To selectively couple bit-lines "bit" and/or "notbit" to the low potential in order to perform the method of the invention described hereinabove, switching circuitry (30), as illustrated in FIG. 5, can be used. The circuitry has three inputs, testenable, testsetup, and testdata. Input testenable is connected to an inverter (inv3) which inverts the signal and is then input to two NOR gates, wbnor3 and wbnor4. While testenable is low, the outputs of wbnor3 and wbnor4, C1 and C2 respectively, are also both low and thus transistors M7 and M8 are off. When testenable is high, the output of wbnor3 will be the inverse of the output of wbnor1, while the output of wbnor4 will be the inverse of wbnor2. Thus, when testenable is low, the test is disabled and when it is is enabled.

Input testsetup is used to control the values of the outputs of wbnor1 and wbnor2. When testsetup is low, both wbnor1 and wbnor2 will output a low which has the effect, depending on the value of testenable, of either:

doing if testenable is low, or turning on both M7 and M8 if testenable is high.

When testsetup is high, the outputs of wbnor1 and wbnor2 depend on the value of testdata. Table 1 shows the various combinations possible:

TABLE 1

| testsetup | testdata | wbnor1 | wbnor2 |
|---|---|---|---|
| 0 | 0 | 0 | 0 |
| 0 | 1 | 0 | 0 |
| 1 | 0 | 1 | 0 |
| 1 | 1 | 0 | 1 |

The overall result when testenable is also taken into account is shown in Table 2:

TABLE 2

| test-enable | testsetup | testdata | wbnor3 | wbnor4 | circuit status | note |
|---|---|---|---|---|---|---|
| 0 | 0 | 0 | 0 | 0 | Not Testing | 1 |
| 0 | 0 | 1 | 0 | 0 | Not Testing | 1 |
| 0 | 1 | 0 | 0 | 0 | Not testing | 1 |
| 0 | 1 | 1 | 0 | 0 | Not Testing | 1 |
| 1 | 0 | 0 | 1 | 1 | M7 on, M8 on | 2 |
| 1 | 0 | 1 | 1 | 1 | M7 on, M8 on | 2 |

TABLE 2-continued

| test-enable | testsetup | testdata | wbnor3 | wbnor4 | circuit status | note |
|---|---|---|---|---|---|---|
| 1 | 1 | 0 | 0 | 1 | M7 on, M8 off | 3 |
| 1 | 1 | 1 | 1 | 0 | M7 off, M8 on | 4 |

Note 1: Bit-lines are unaffected by the test circuit, so normal memory operation takes place.

Note 2: Both bit-lines are connected to a low potential via M7 and M8.

Note 3: The bit-line connected to M7 is connected to a low potential; the opposite bit-line 'floats'.

Note 4: The bit-line connected to M8 is connected to a low potential; the opposite bit-line 'floats'.

Figure 6A:
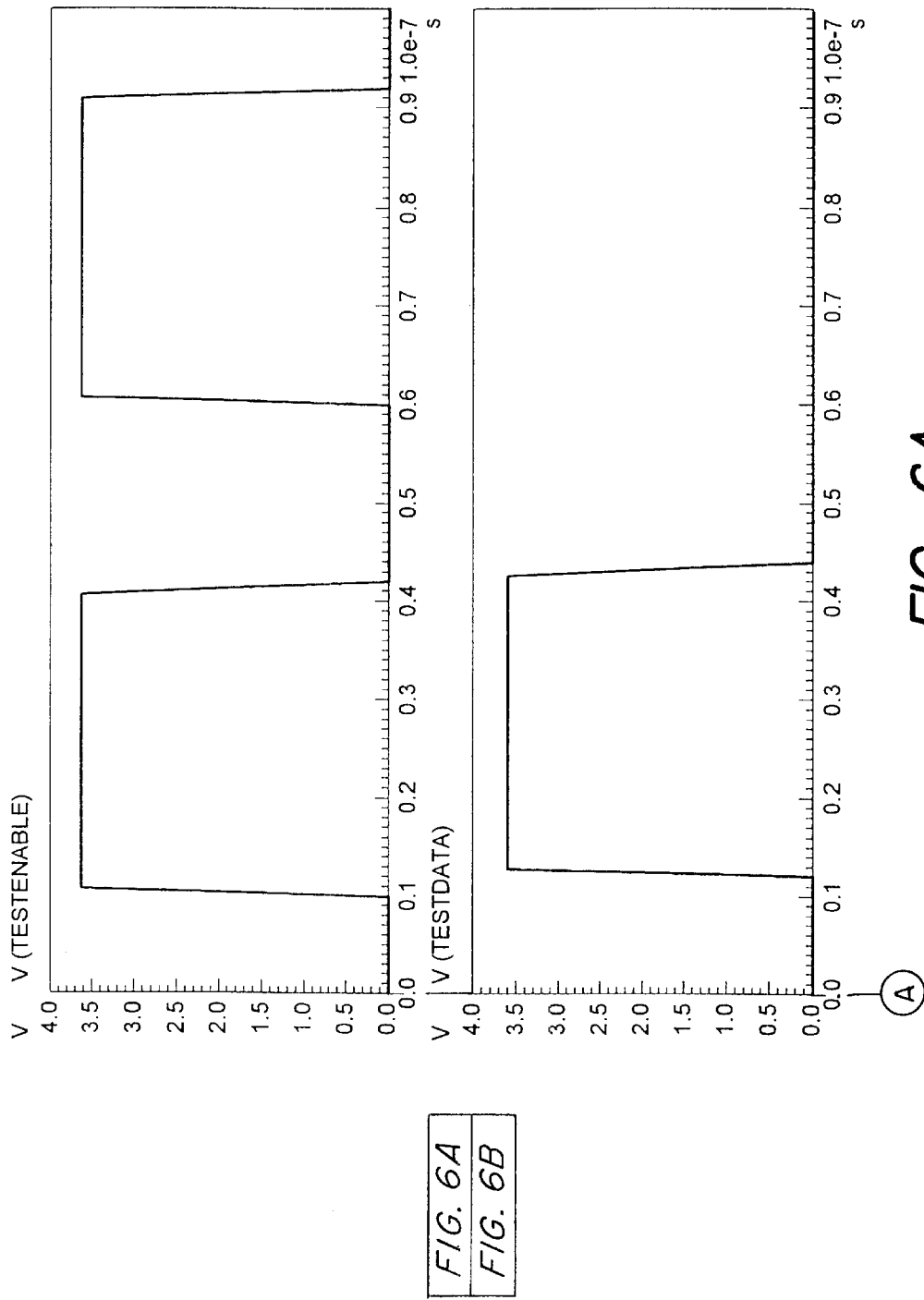
FIGS. 6–13 shows waveform results when applying the test under various circumstances.
Figure 6B:
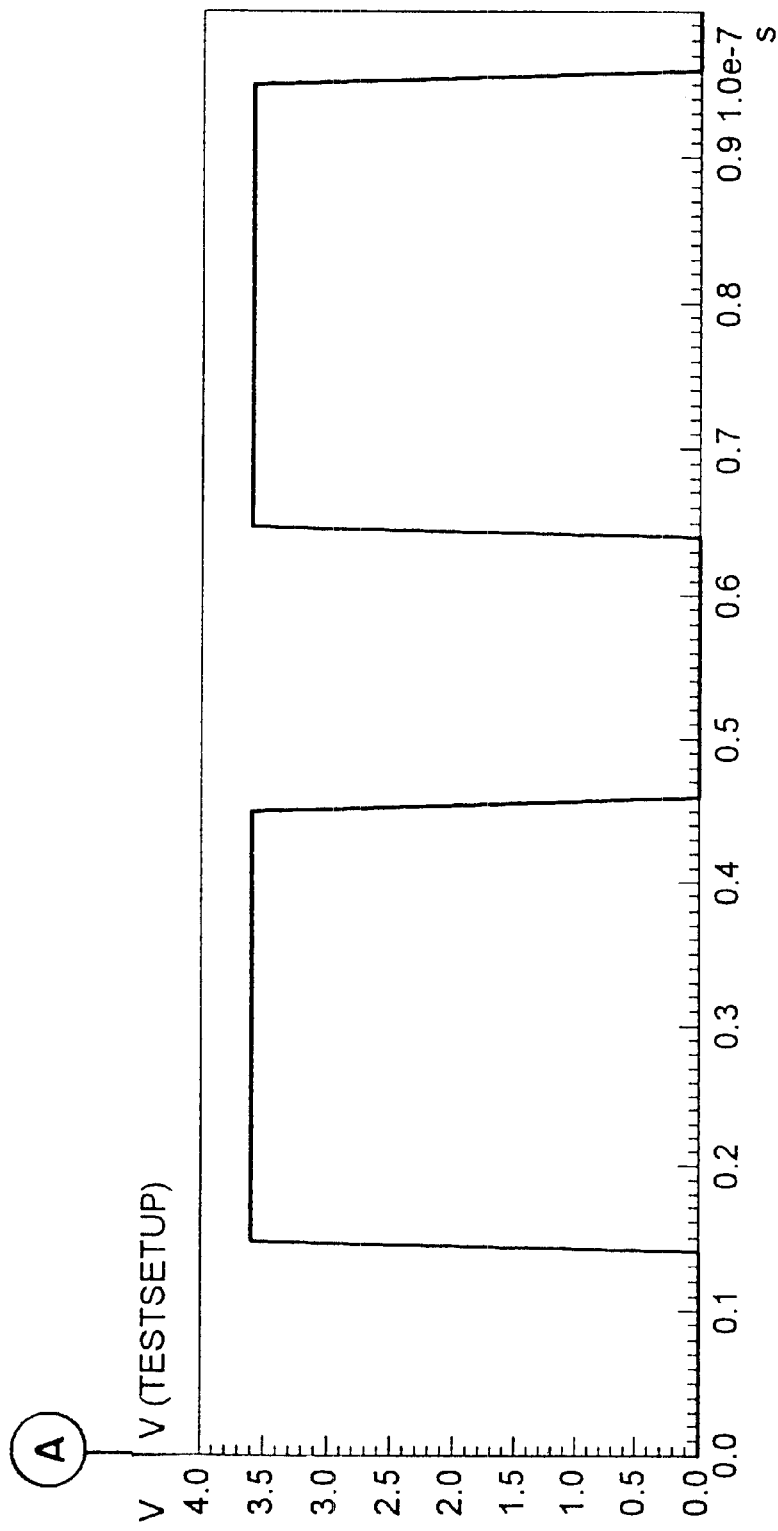

FIGS. 6a–B show the sequence of waveforms applied to the three inputs testenable, testsetup and testdata when a cell with an operating voltage of 3.6 volts is under test. The test shown is 100 ns long during which time the weak bit test is applied twice, once to the side of the cell containing the first node N1 from 0–50 ns and once to the side of the cell containing the second node N2 from 10–100 ns. Thus, as can be seen, for the testing of the CRC on both sides of the cell the inputs applied to testenable and testsetup are identical while the input applied to testdata is high when testing the CRC on the first side of the cell and low when testing the CRC on the second side of the cell.

FIGS. 7 to 13 show waveform results when applying the test under various circumstances.

Figure 7A:
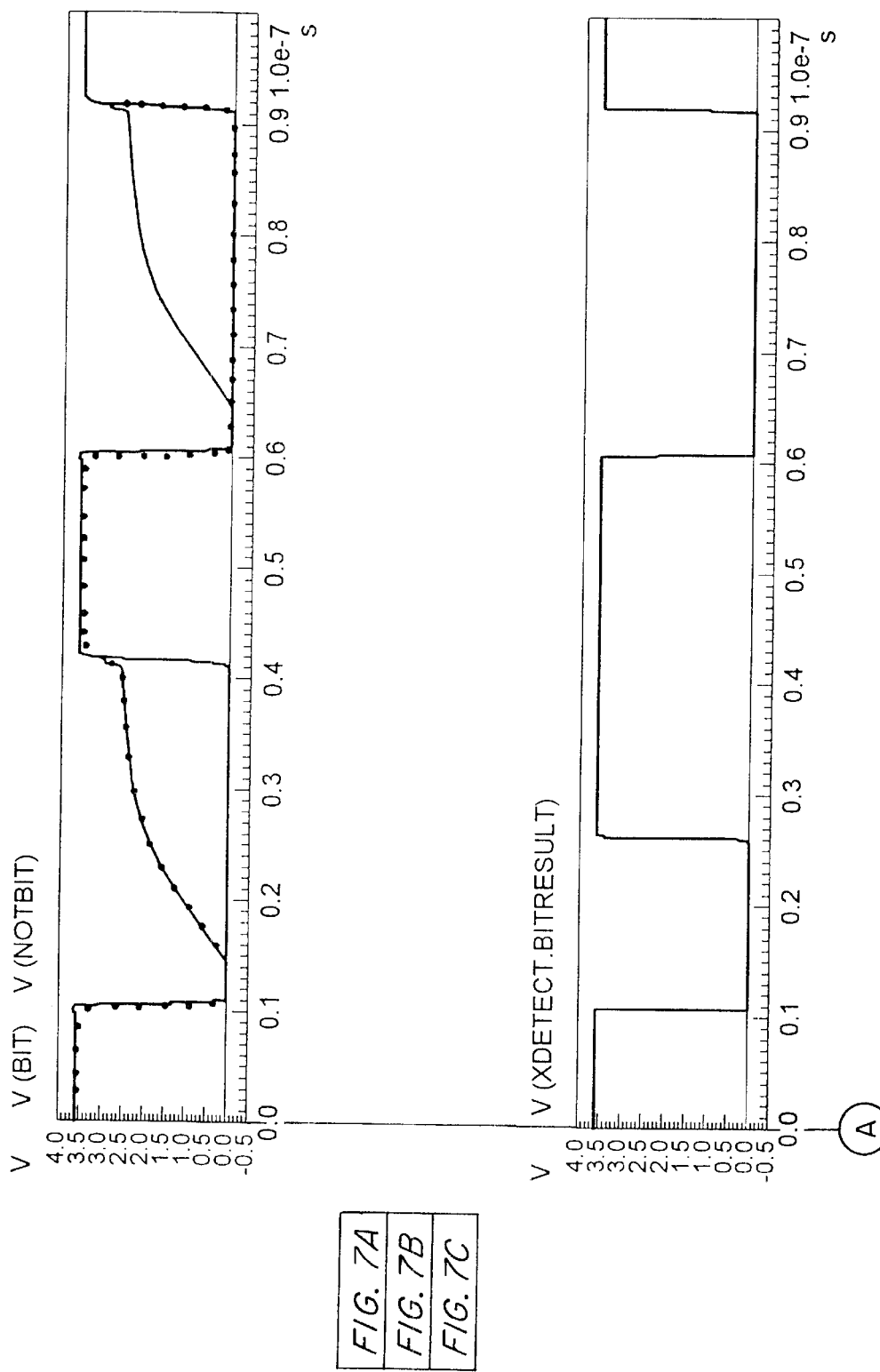
Figure 7B:
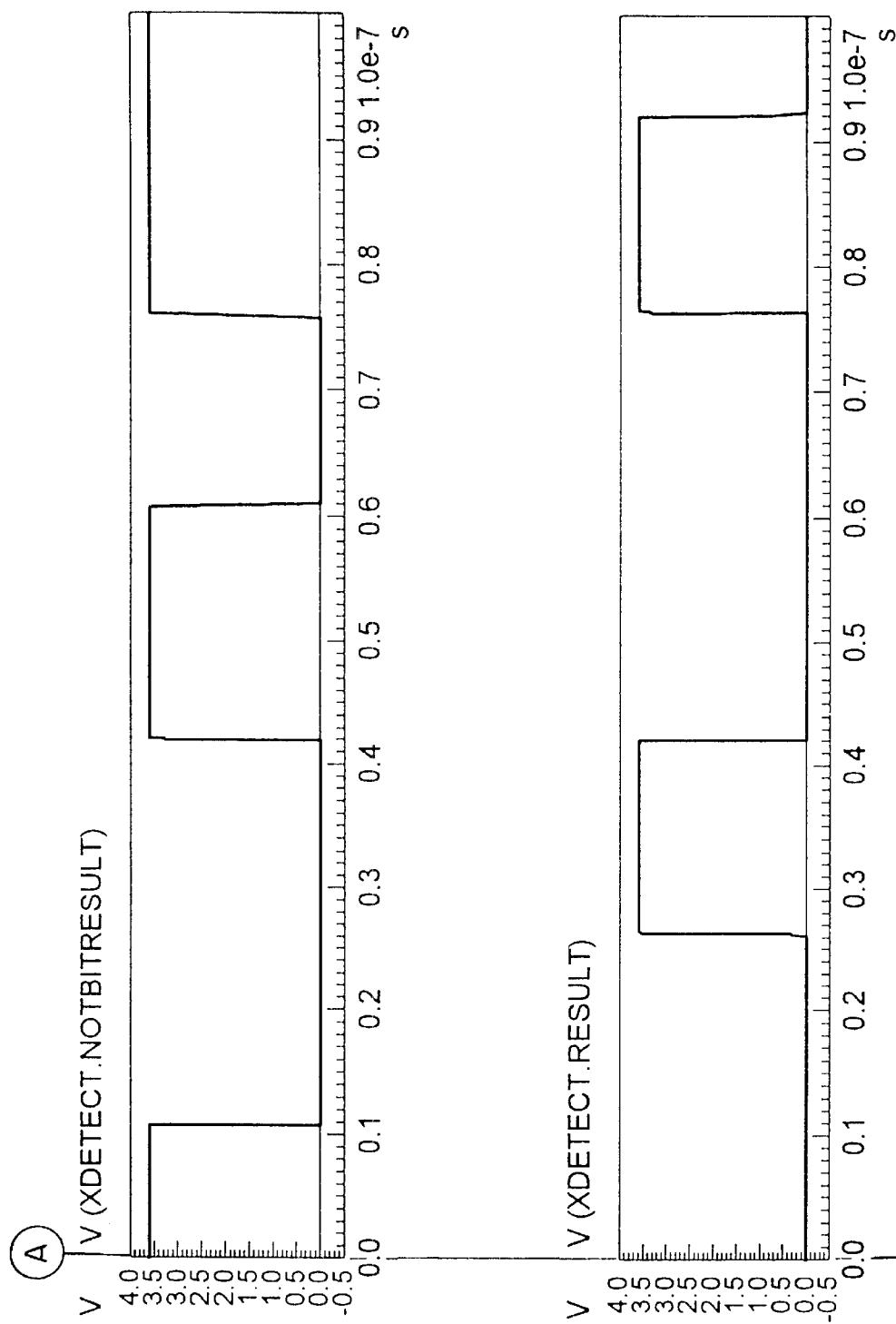
Figure 7C:
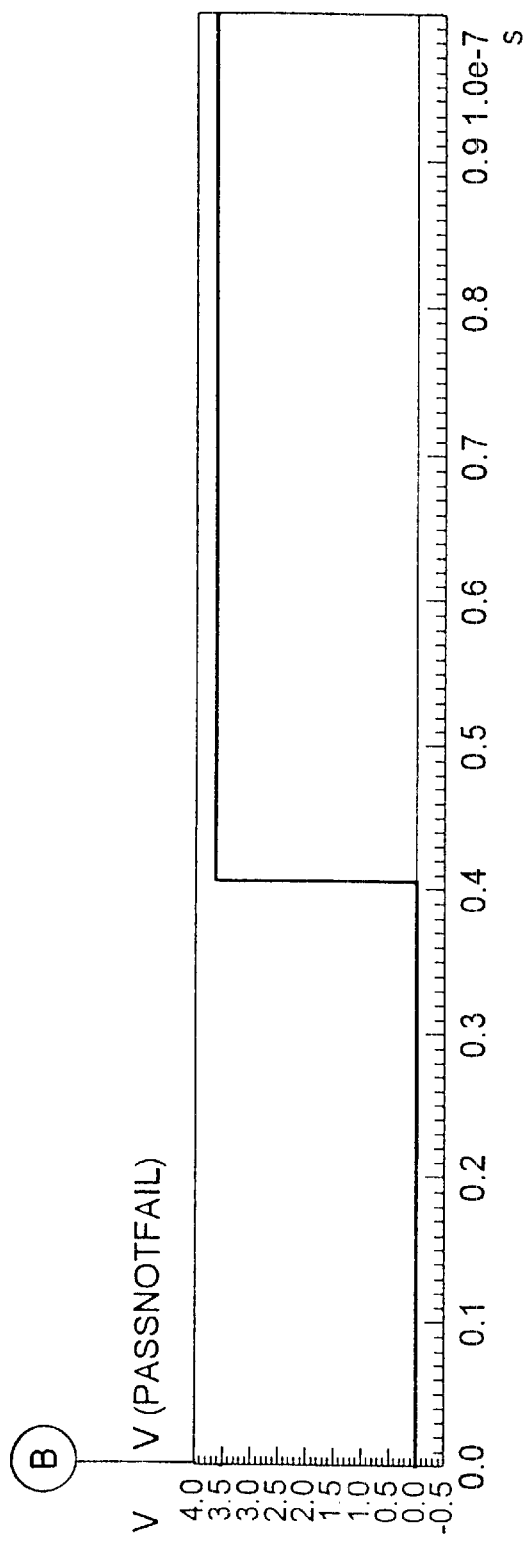

FIGS. 7A–C show the results of the test when applied to a single cell, testing firstly node N1 and secondly node N2. Node N1 is tested from 0–50 ns and node N2 is tested from 50100 ns. The whole test is thus 100 ns long, as indicated by the horizontal scale. The top plot shows the voltages on bit-lines "bit" and "notbit" respectively. Between times 0 ns and 10 ns, "bit" and "notbit" are connected to a high potential by a precharge circuit (20) and the weak bit test circuit is off since testenable is low.

With reference also to FIGS. 6A–B, at 10 ns, the precharge circuit is turned off and testenable is sent high thus enabling the test circuit. As a result of testenable becoming a high potential, both bit-lines are connected to a low potential through transistors M7 and M8.

At 12 ns, testdata is sent high denoting that the CRC of the first node N1 is to be tested (see Table 2).

At 14 ns, testsetup is sent high. Since testdata is also high, this has the effect of turning off transistor M7 whilst keeping transistor M8 turned on (Table 2). Thus, "notbit" remains connected to the low potential whilst "bit" is disconnected from the low potential. Since the CRC connected to the first node N1 is present and working correctly, it can now supply charge to node N1. The potential on node N1's respective bit-line "bit" therefore increases with time. In FIGS. 7A–C, this is shown in the first plot by the increasing waveform (dotted) from 14–41 ns. The voltage threshold for the detector circuit connected to "bit" is met at time 26 ns as shown in the second and fourth plots.

The trace in third plot of FIGS. 7A–C remains flat at 26 ns since transistor M8 is connecting At notbit" to a low potential and the other trace (solid line) in the first plot also remains flat from 11–41 ns for the same reason.

As the test ends at 41 ns, the value on the fourth plot of Fogs/ 7a–C is latched in the detector and is shown on the final plot.

From 42–50 ns, the test circuit is disconnected and the precharge circuit (20) connects both bit-lines to a high potential.

From 50–100 ns, the sequence is repeated; however, testdata is connected to a low potential which causes "bit" to be connected to a low potential and held there and 41 notbit" to be initially connected to a low potential and then released. Thus, the potential on "notbit" rises between 64–91 ns and the threshold circuit triggers at 76 ns.

At 91 ns, the value on the fourth plot is again latched in the detector and is shown in the final plot. Since the previous result of the test was a pass, the waveform does not change at this point.

Figures 8A, 8B, 8C:
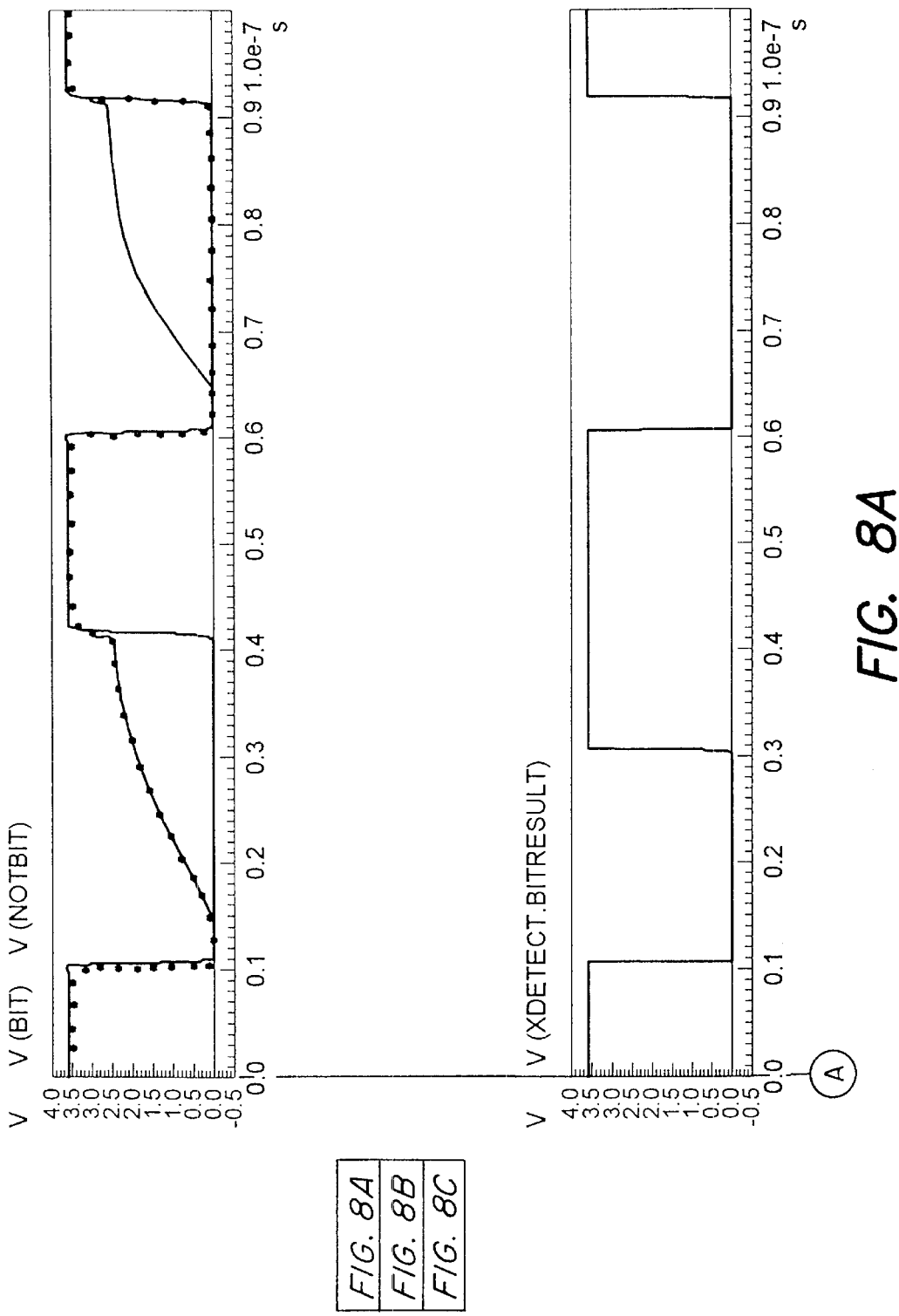
Figure 8B:
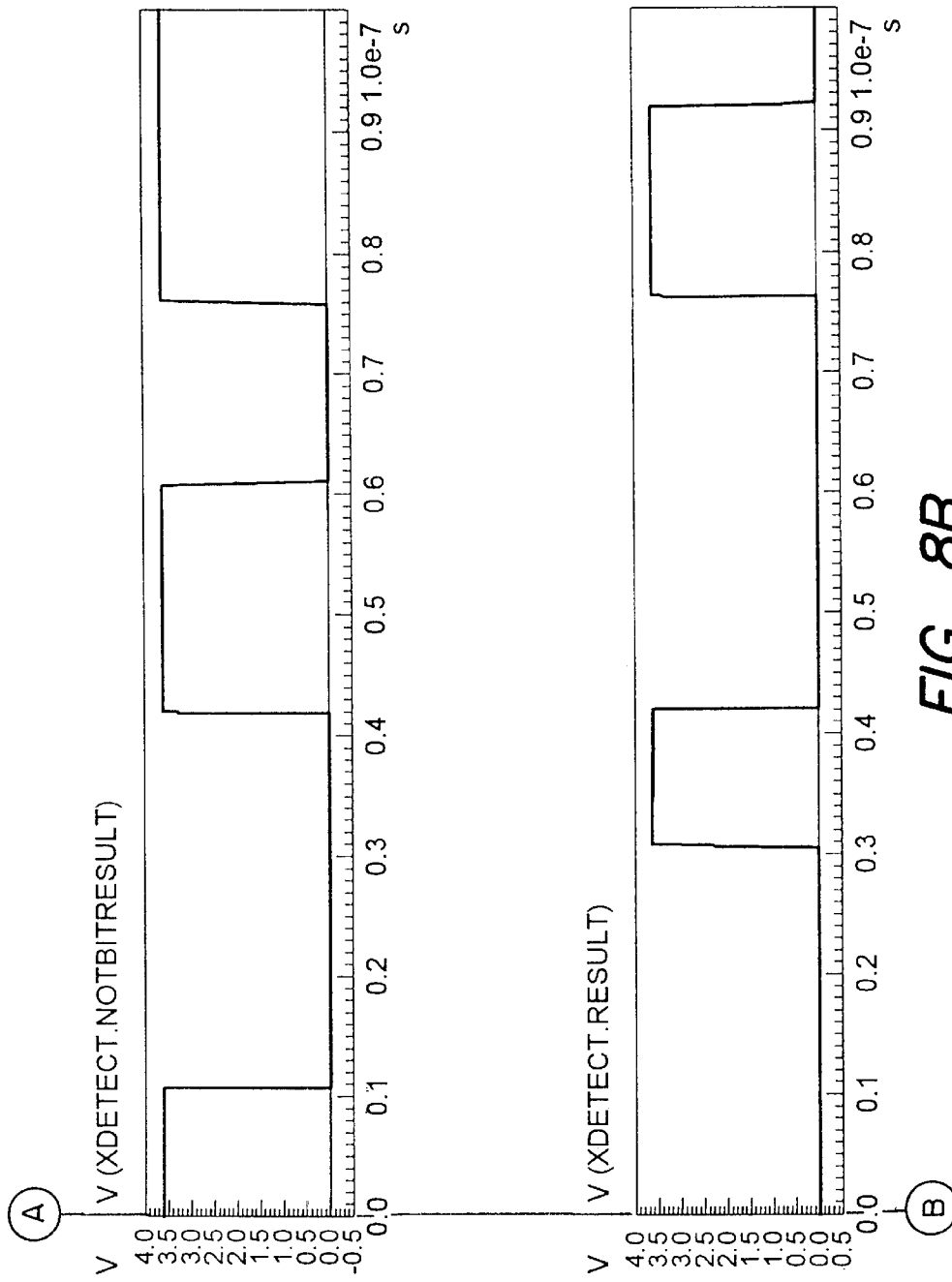
Figure 8C:
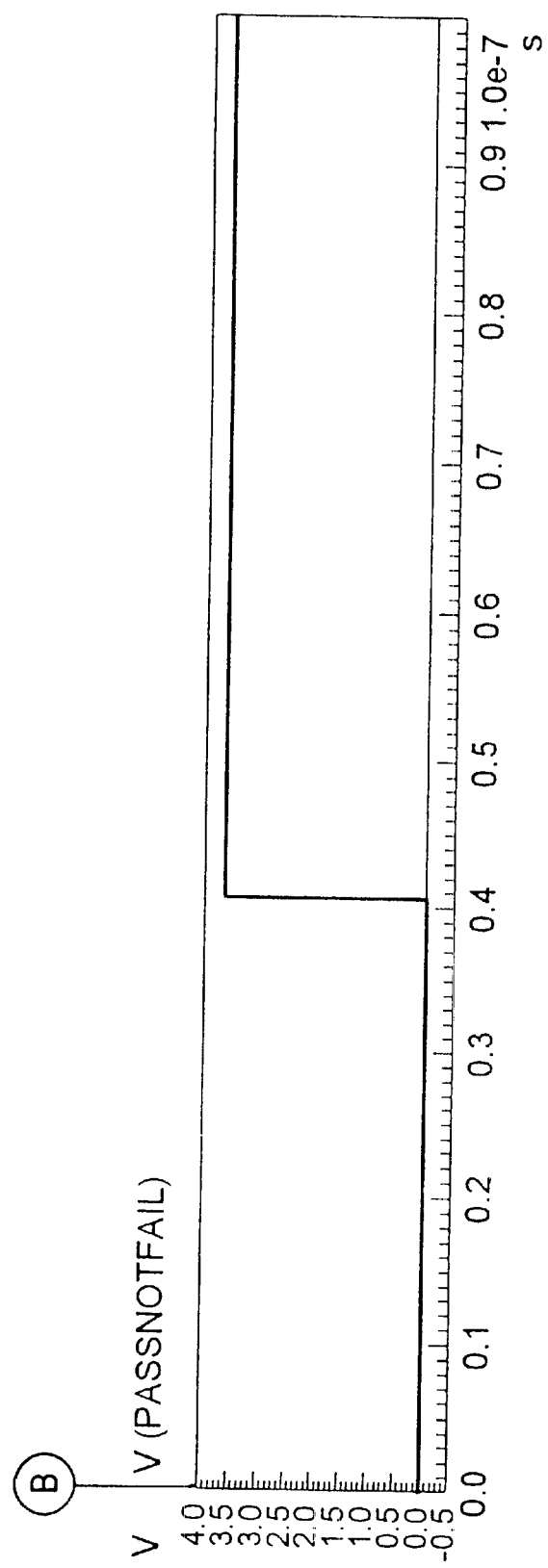
Figure 9A:
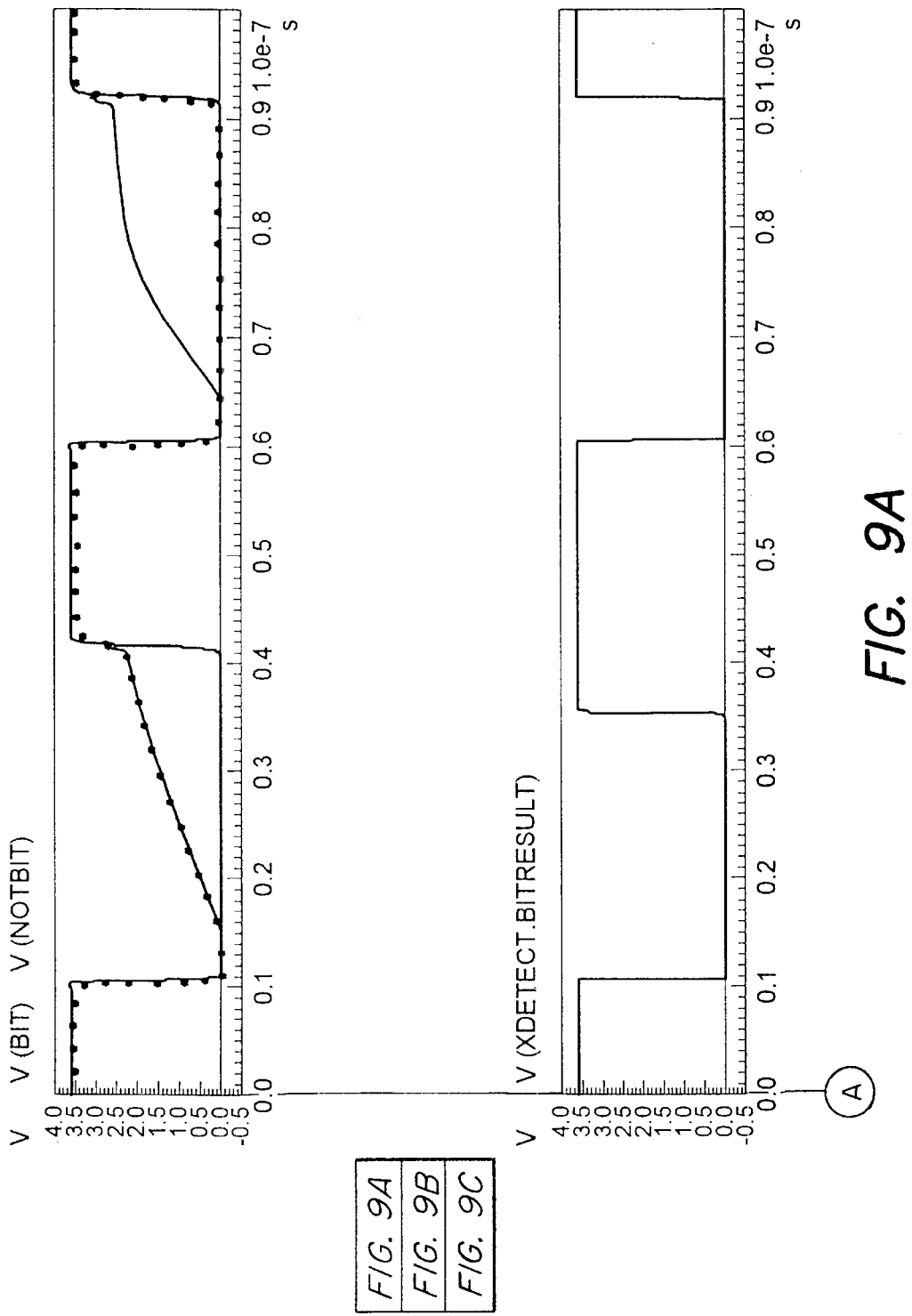
Figure 9B:
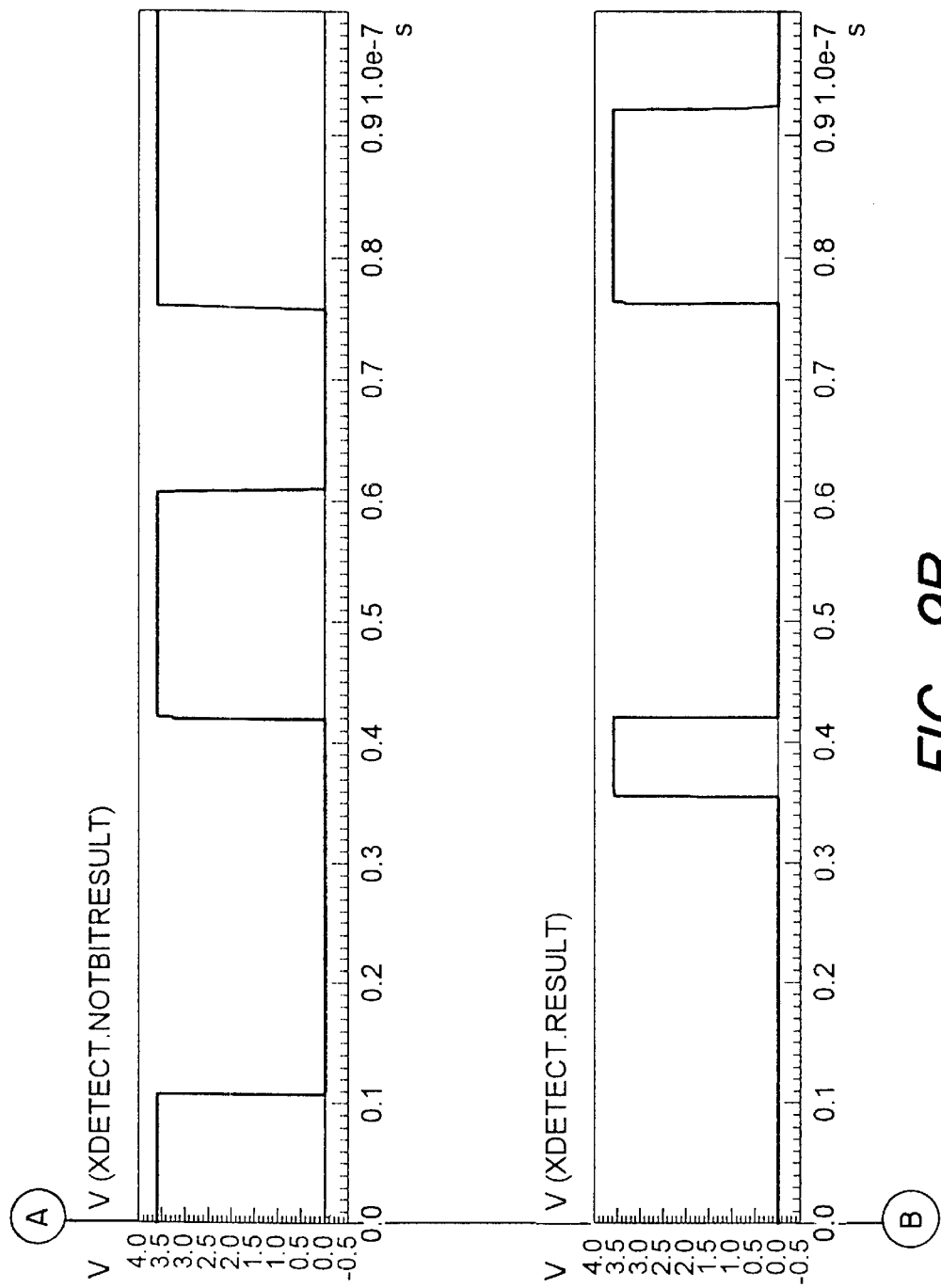
Figure 9C:
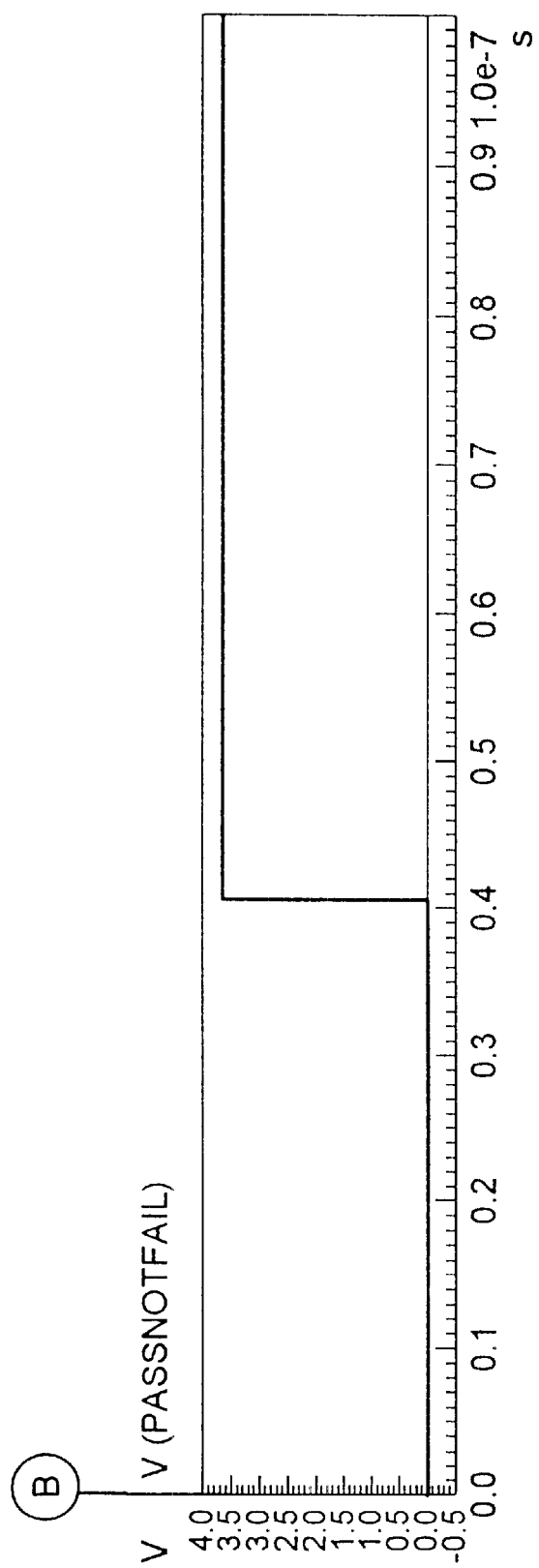
Figure 10A:
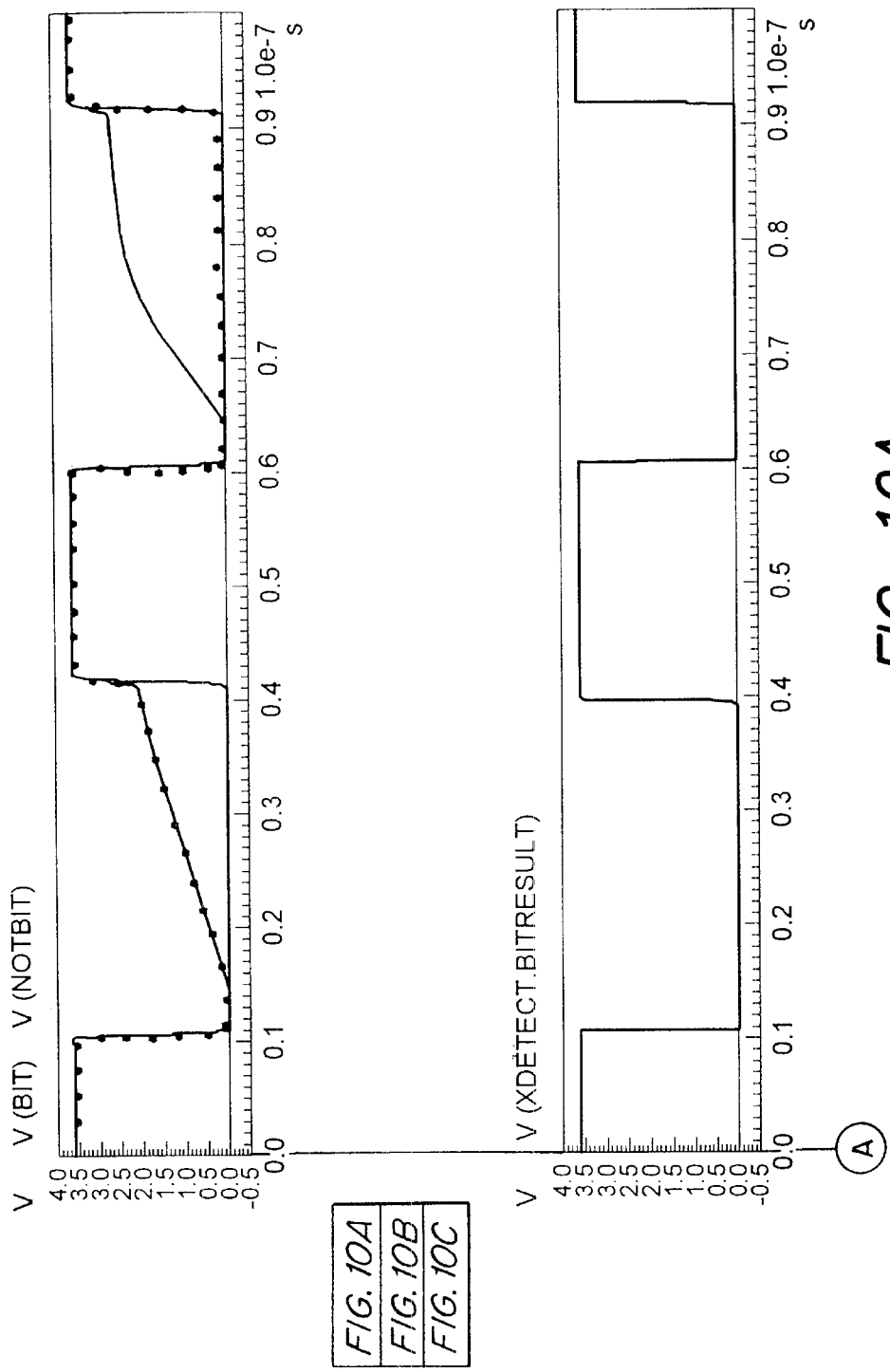
Figure 10B:
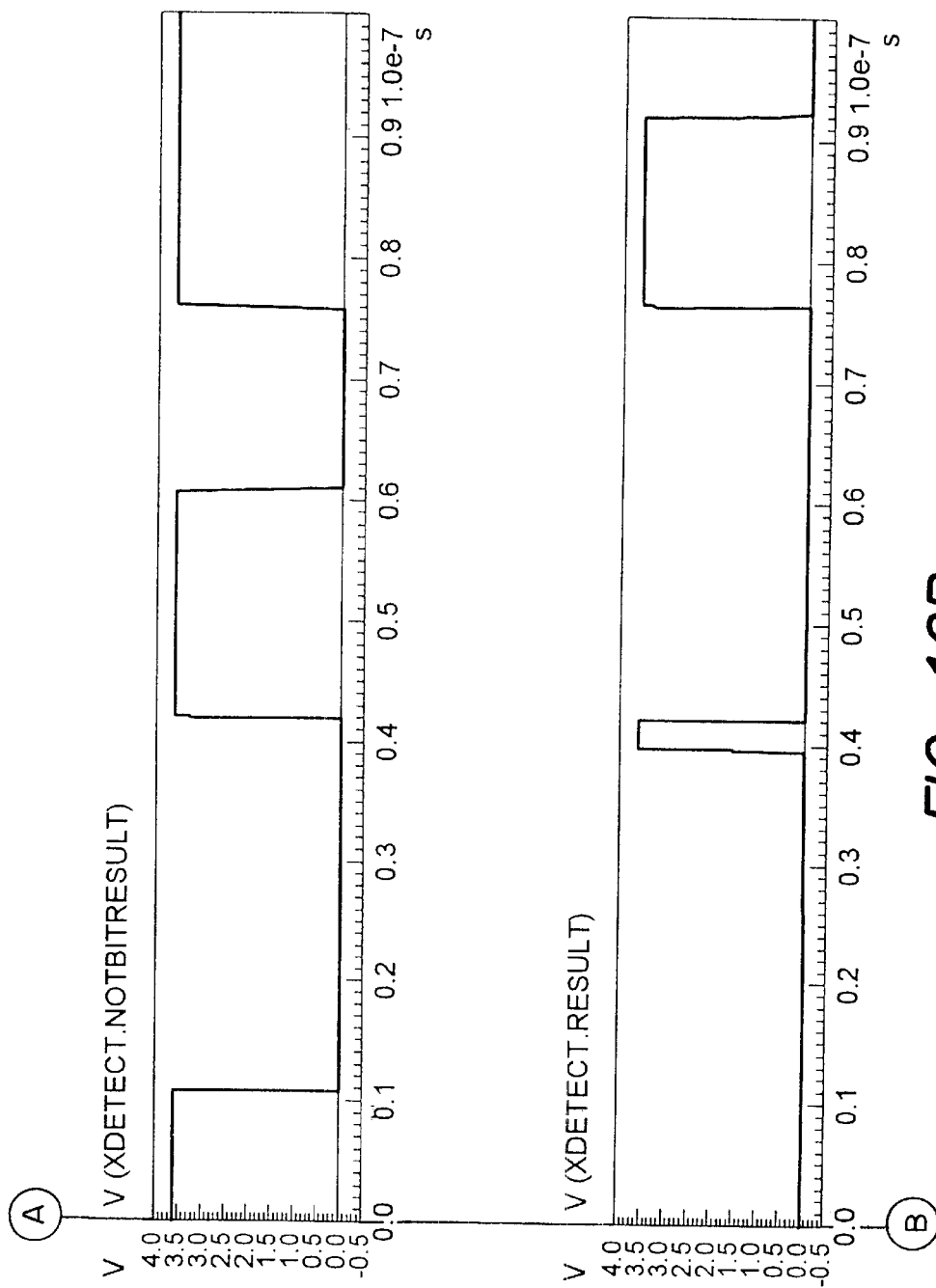
Figure 10C:
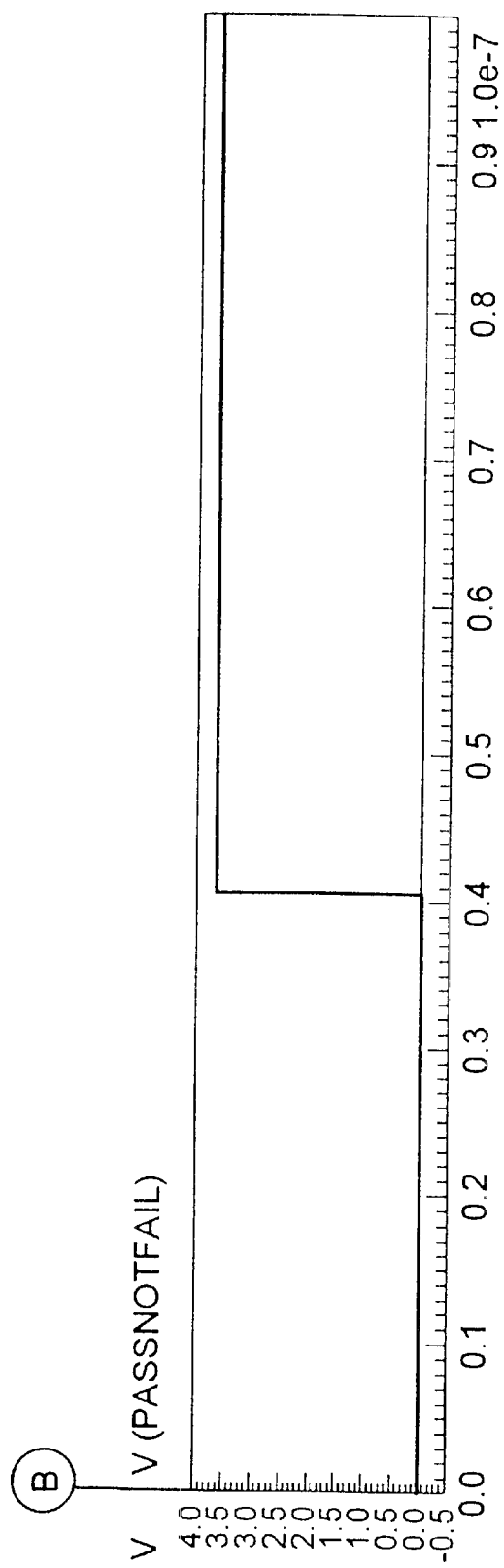

FIGS. 8A–C show a similar test but with a fault in the CRC connected to the first node N1. The fault is represented by a 5K ohm resistance between the CRC supply voltage and the CRC transistor. It can be seen that the dotted trace in the first plot in FIGS. 8A–C rises more slowly than the equivalent trace in FIGS. 7A–C. and that the threshold circuit triggers at a later point. This is due to the fact that the added resistance of the fault reduces the current that the CRC on that side can supply to the cell.

As can be seen from the final trace in FIGS. 8A–C, the result of the test is still a pass. The trace representing the testing of the CRC connected to the second node N2 does not differ from the equivalent trace in the first plot of FIGS. 7A–C since no fault has been introduced to that side of the memory cell.

FIGS. 9A–C and 10A–C repeat the test but with faults introduced to the CRC of the first node N1 representing resistances of 10K ohms and 15K ohms respectively. In both cases, the result of the test is still a pass but the rising traces in the first plots become successively shallower and the threshold circuit triggers later.

Figures 11A, 11B, 11C:
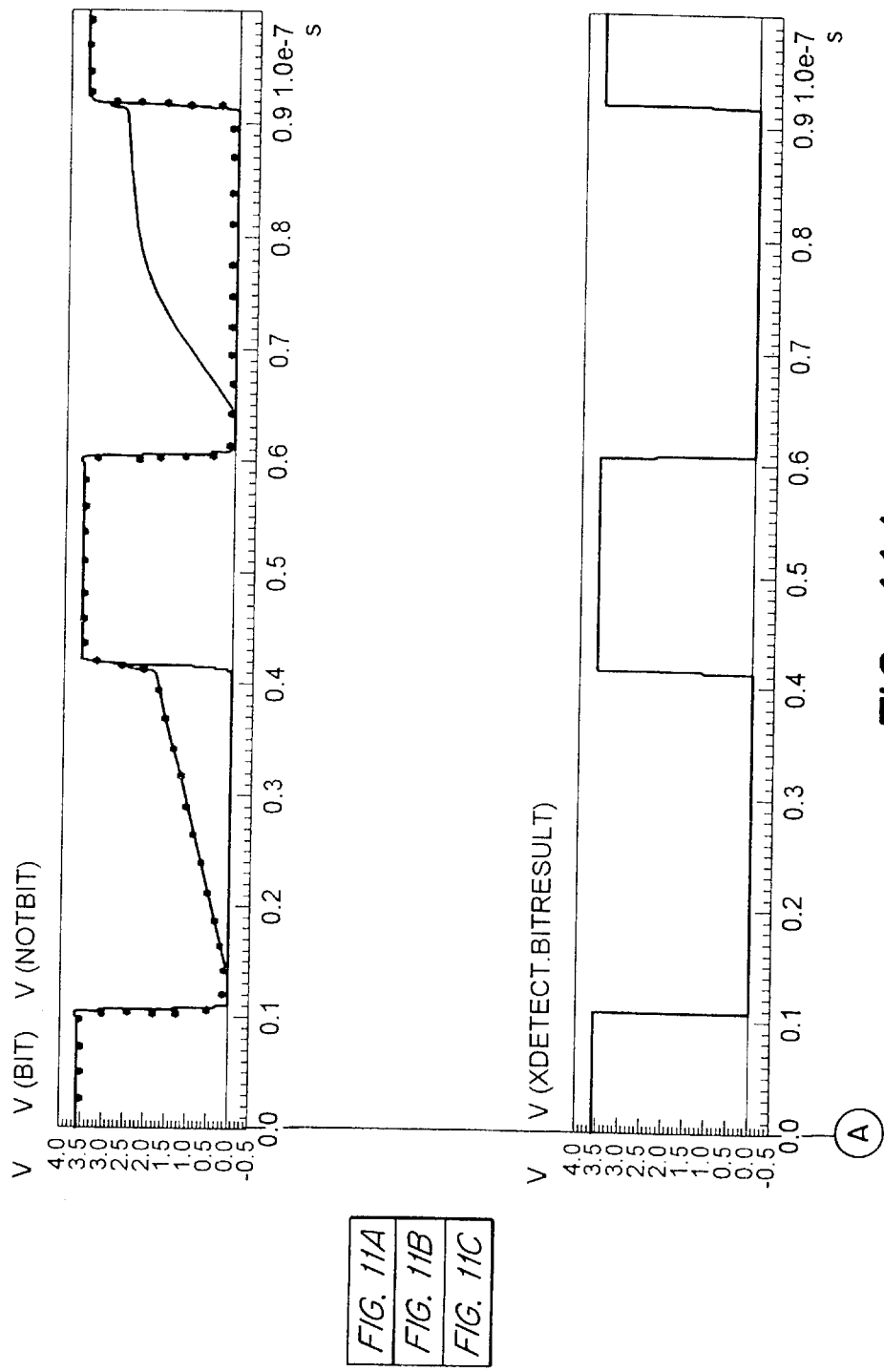
Figure 11B:
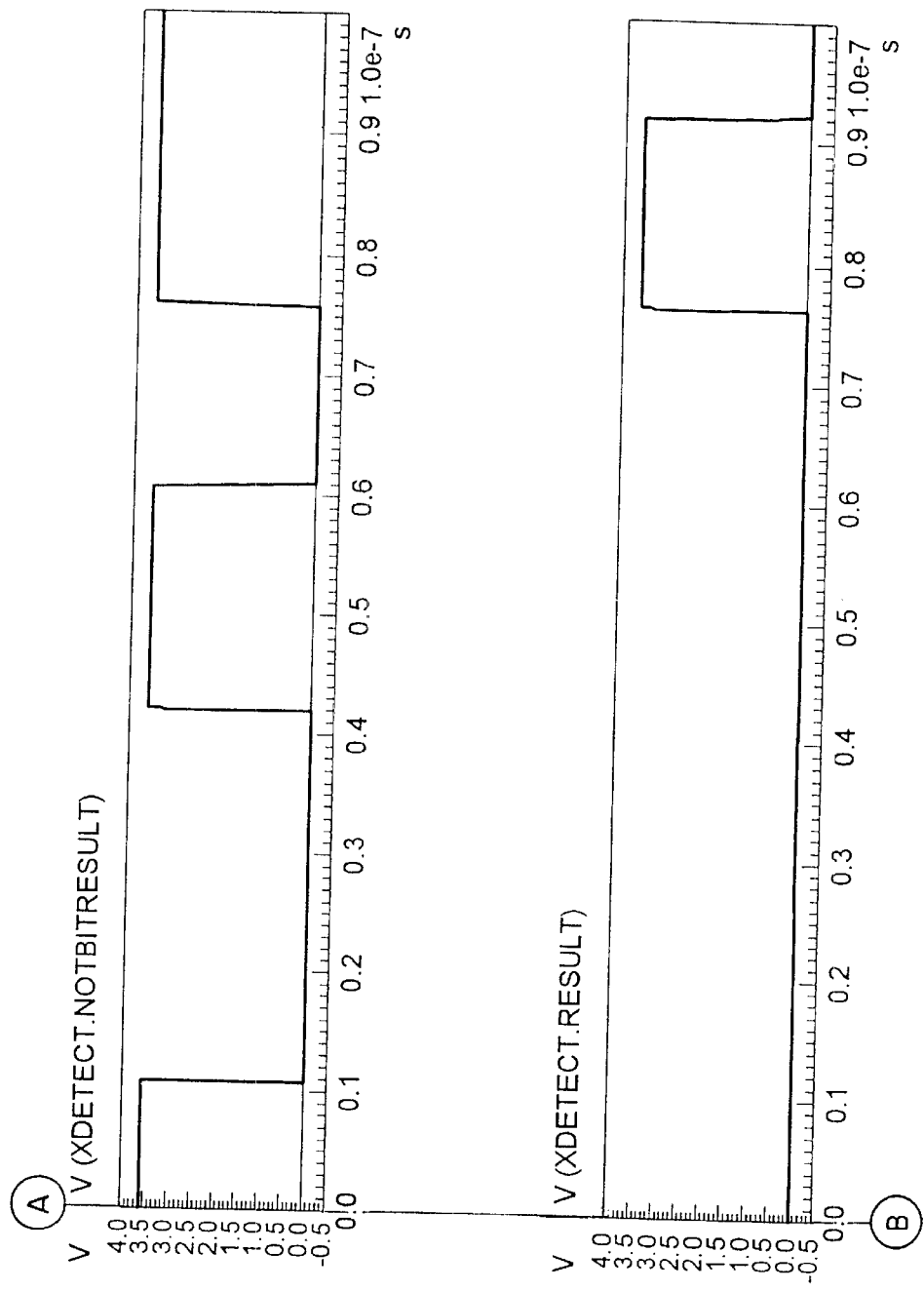
Figure 11C:
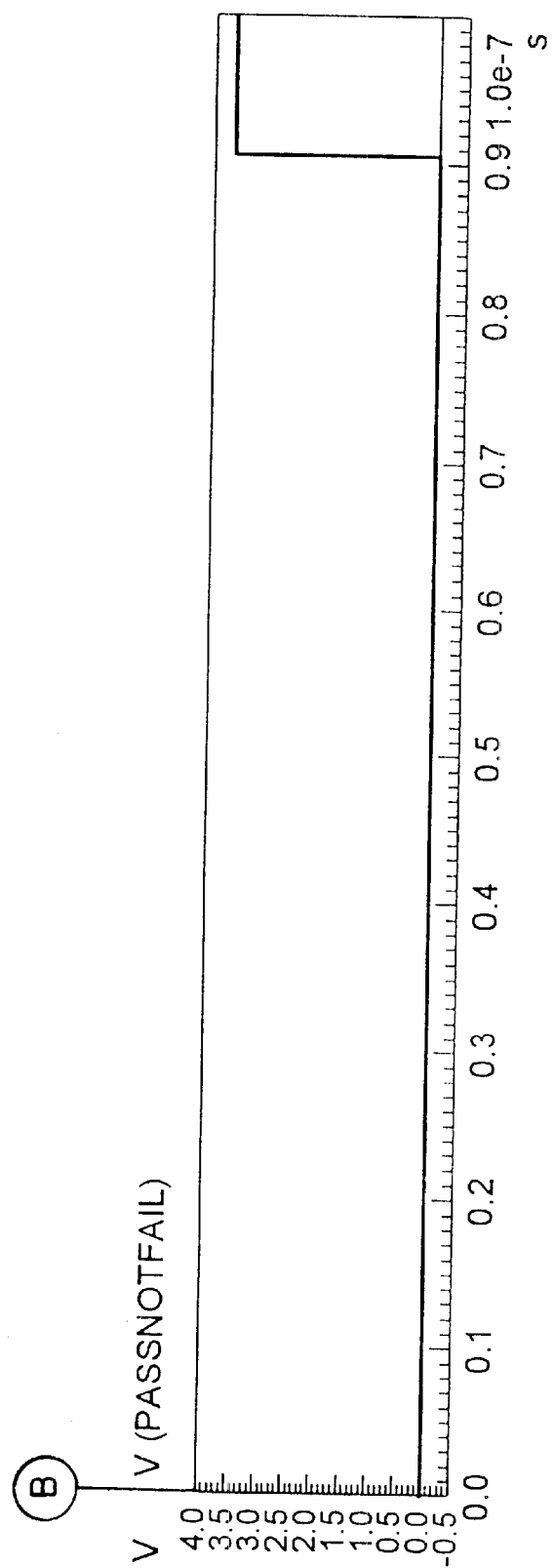
Figure 12A:
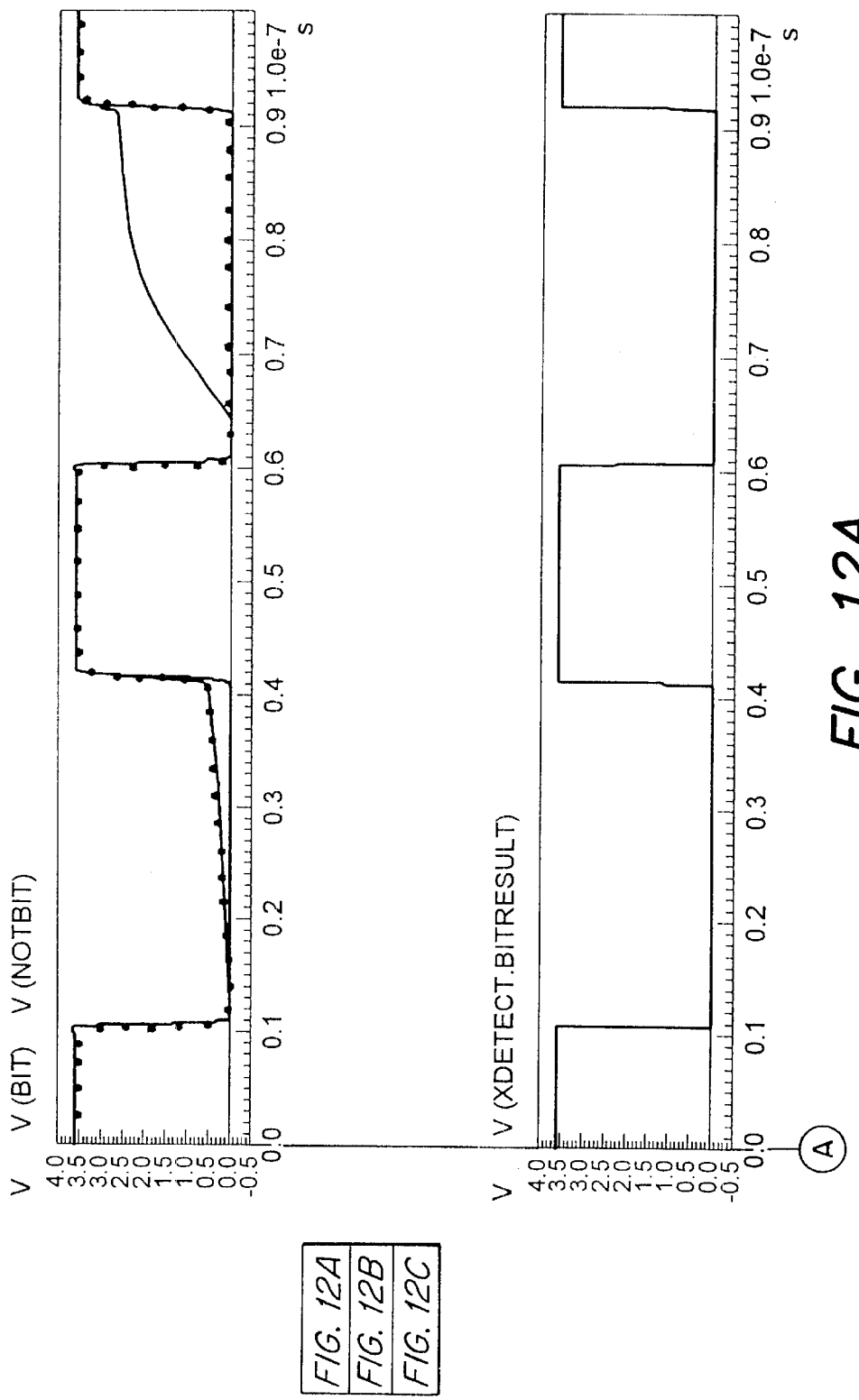
Figure 12B:
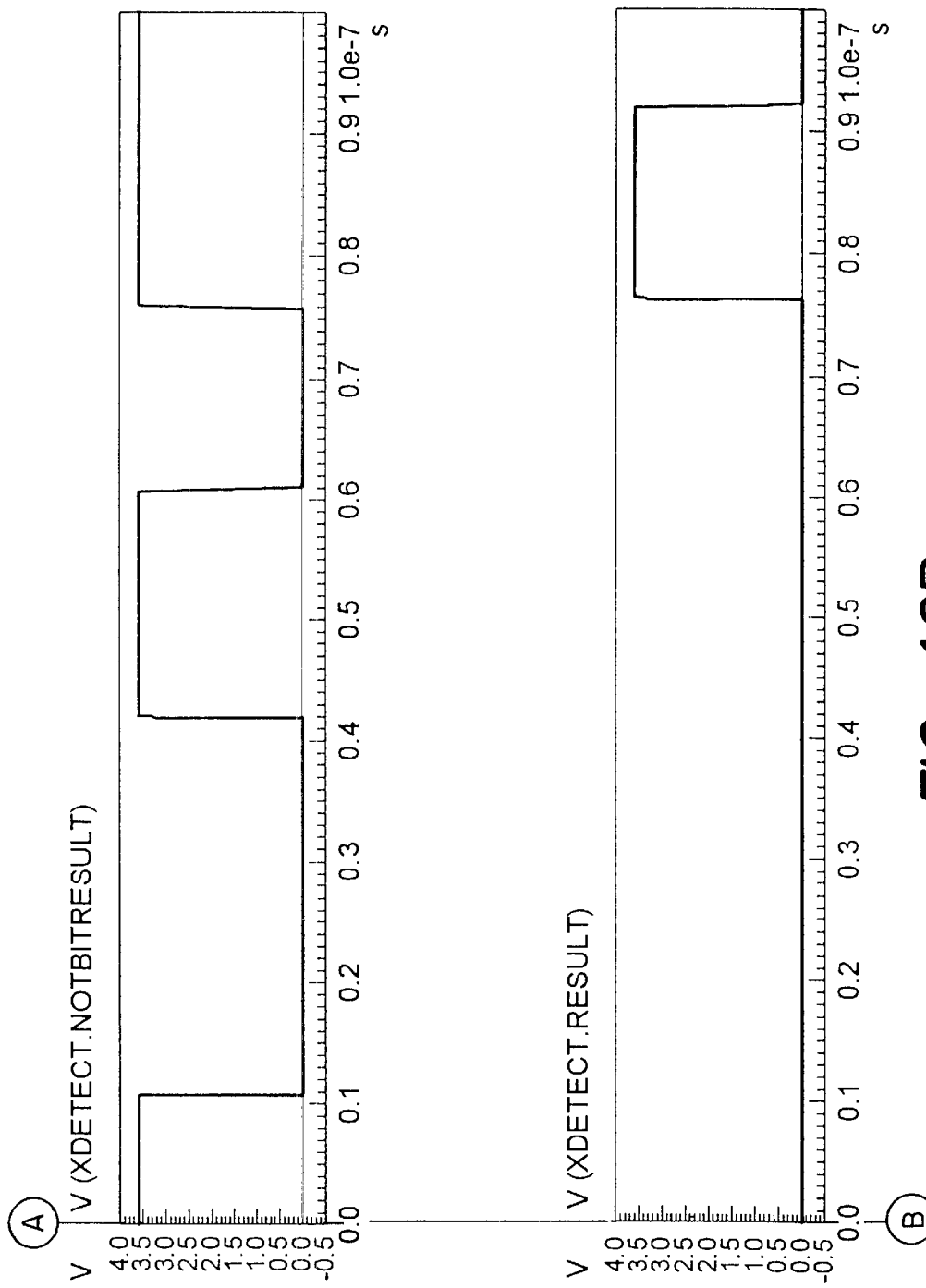
Figure 12C:
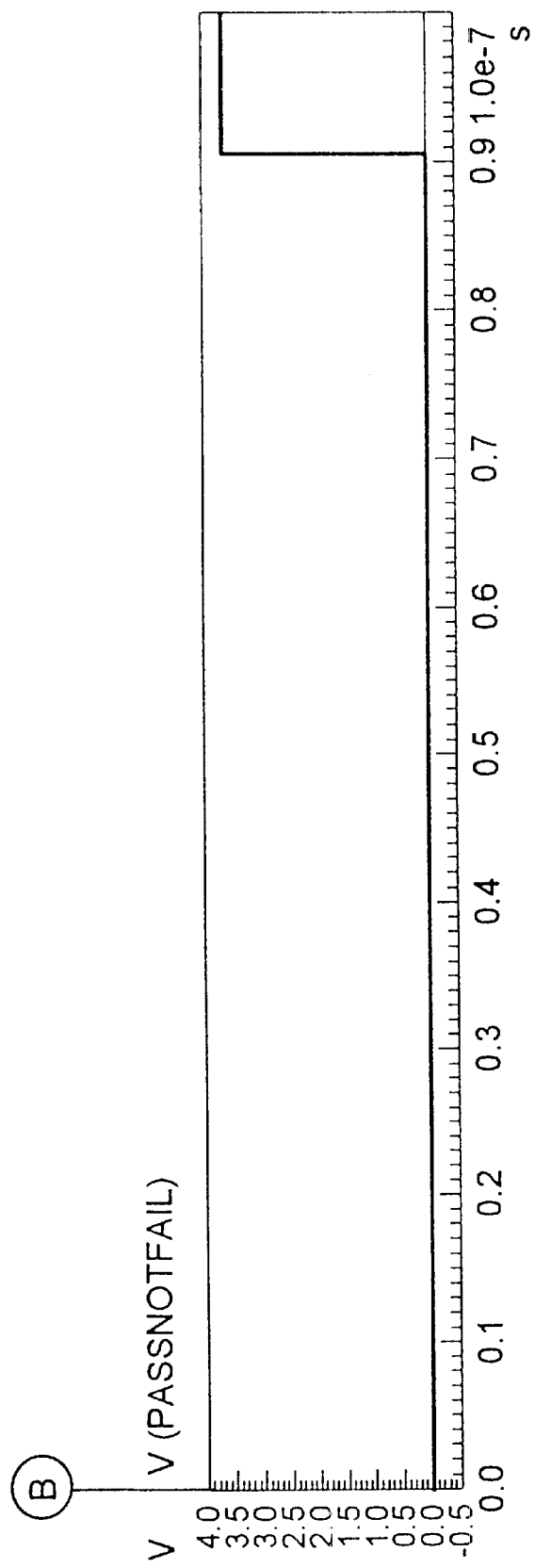
Figure 13A:
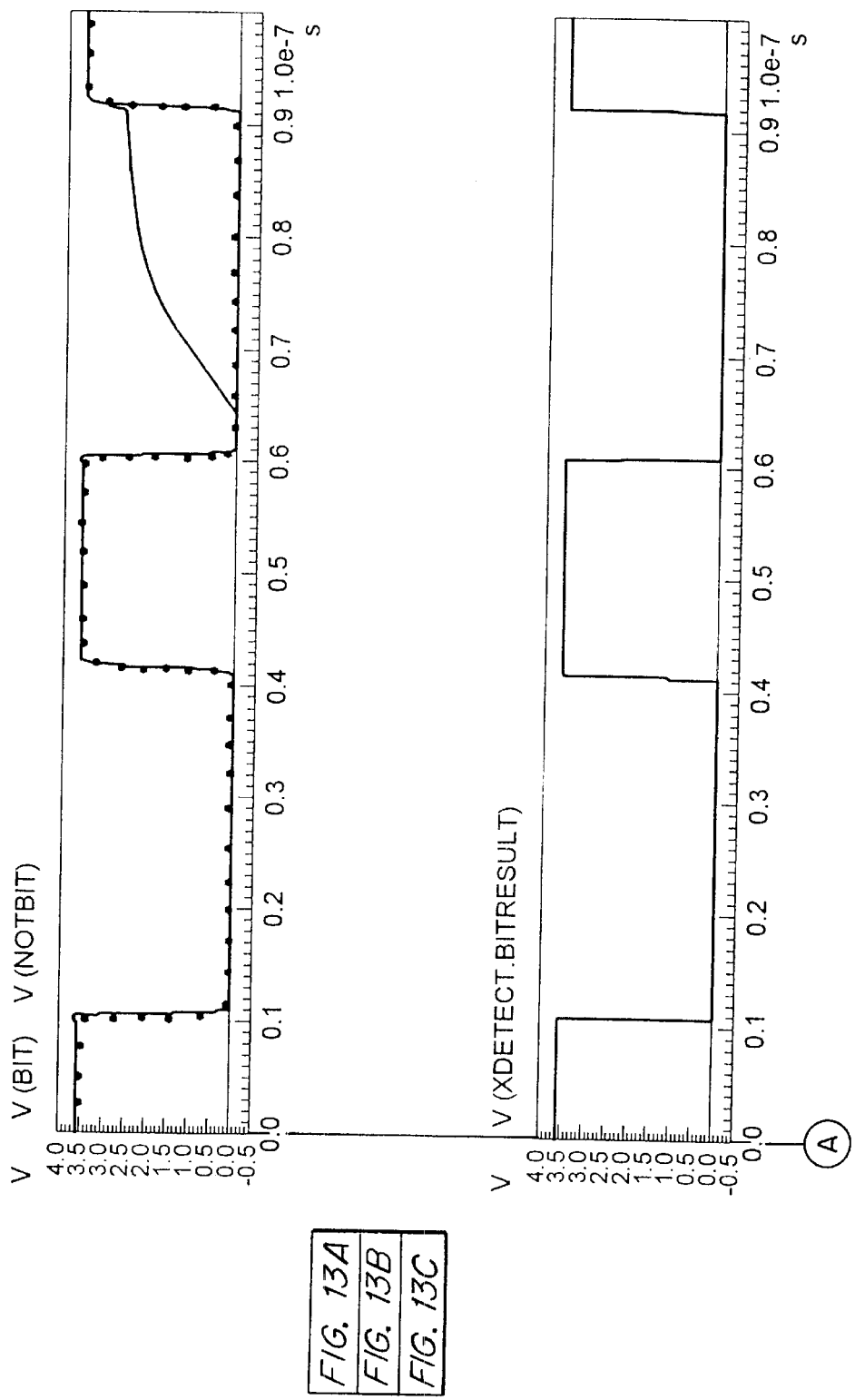
Figure 13B:
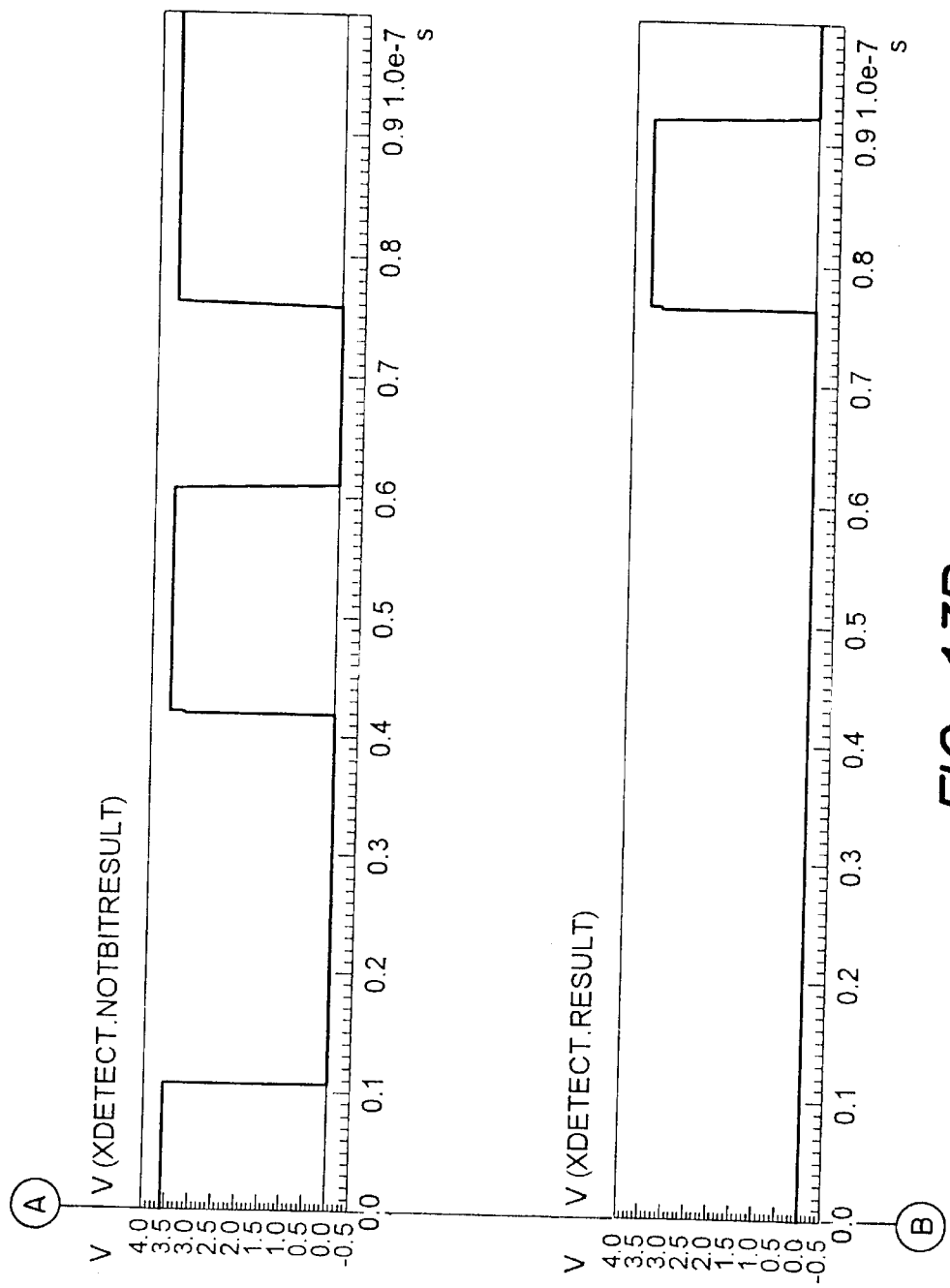
Figure 13C:
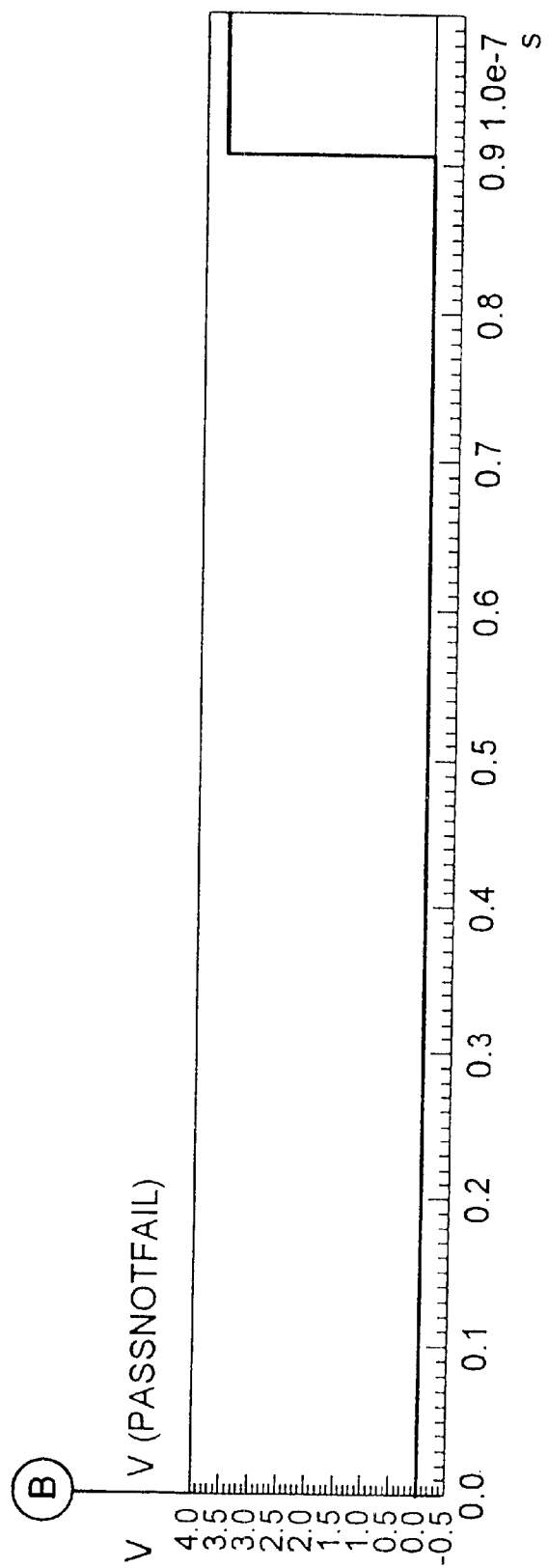

FIGS. 11A–C show a test with a fault to the CRC of the first node N1 of 20K ohms. This time, the threshold circuit does not trigger (fourth plot) indicating a failure. The CRC 16 connected to the second node N2 still passes the test since it has no fault associated with it. It is possible to grade the severity of the faults by detecting the time that the threshold circuit triggers. If the test were allowed to be run for a longer time, say 1 00ns for each side of the cell, such a faulty CRC may pass the test.

FIGS. 12A–C and 13A–C show the results of test where the CRC connected to the first node N1 are of 100K ohms and 1M ohms respectively. In these cases the charging rate is either very low or undetectable and in both cases, the result is a fail.

In all cases, once one CRC of the cell has been tested, an analogous procedure may be carried out to test the other CRC of the cell as shown from time 50–100 ns in FIGS. 6 to 13.

It will be understood that the above description is not intended to limit the invention in any way, the scope of which is set out in the appended claims. The present invention may include any feature or combination of features disclosed herein either implicitly or explicitly together or in isolation, or any generalization thereof irrespective of whether it relates to the presently claimed invention. In view of the foregoing description it will be evident to a person skilled in the art that various modifications may be made within the scope of the invention.

I claim:

1. A method for testing a semiconductor memory cell that includes first and second transistors in cross-coupled arrangement to form a bistable latch, drains of the first and second transistors respectively representing first and second nodes each for storing a high or low potential state, the first and second nodes being respectively connected to first and second semiconductor arrangements for replacing charge leaked from the first and second nodes, respectively, and to first and second switching means, activatable by a word-line, for coupling the first and second nodes to respective first and second bit-lines, the method comprising the steps of:

connecting the first and second bit-lines to the low potential;

activating the word-line to connect the first node to the first bit-line to allow any potential on the first node to fall towards a potential on the first bit-line; and monitoring charge flow from the first node to the first bit-line to test operation of the first semiconductor arrangement.

2. A method according to claim 1, wherein the first semiconductor arrangement is deemed to be functioning if the charge flow from the first node to the first bit-line reaches a predetermined level.

3. A method according to claim 2, wherein a level that the charge flow from the first node to the first bit-line reaches is measured by a threshold circuit.

4. A method according to claim 1, wherein the first semiconductor arrangement is deemed not to be functioning if the charge flow from the first node to the first bit-line does not reach a predetermined level.

5. A method according to claim 1, wherein the charge flow from the first node to the first bit-line is determined by disconnecting the first bit-line from the low potential and thereafter measuring the potential of the first bit-line.

6. A method according to claim 5, wherein the first semiconductor arrangement is deemed to be functioning if the potential of the first bit-line reaches a predetermined level within a predetermined period of time.

7. A method according to claim 6, wherein the potential of the first bit-line is measured by a threshold circuit.

8. A method according to claim 7, wherein the threshold circuit comprises one of a low-threshold inverter and a Schmitt trigger connected to the first bit-line.

9. A method according to claim 5, wherein the first semiconductor arrangement is deemed not to be functioning if the potential of the first bit-line does not reach a predetermined level within a predetermined period of time.

10. A method according to claim 1, wherein the memory cell forms part of a memory array, the memory array comprising a plurality of columns of memory cells and a plurality of rows of memory cells and wherein the memory cells in each column are connected via common bit-lines and the memory cells in each row are connected via common word-lines.

11. A method according to claim 1, wherein the first semiconductor arrangement comprises a PMOS transistor.

12. The method according to claim 1, wherein the first semiconductor arrangement comprises a pair of diodes.

13. The method according to claim 1, wherein the step of activating the word-line includes a step of connecting the second node to the second bit-line.

14. The method according to claim 13, comprising monitoring charge flow from the second node to the second bit-line to test the operation of the second semiconductor arrangement.

15. Apparatus for testing a semiconductor memory cell that includes first and second transistors in cross-coupled arrangement to form a bistable latch, drains of the first and second transistors respectively representing first and second nodes each for storing a high or low potential state, the first and second nodes being respectively connected to first and second semiconductor arrangements for replacing charge leaked from the first and second nodes, respectively, and to first and second switching means, activatable by a word-line, for coupling the first and second nodes to respective first and second bit-lines, the apparatus comprising:

switching circuitry for connecting the first and second bit-lines to the low potential; and testing circuitry connected to the first bit-line for monitoring charge flow from the first node to the first bit-line.

16. Apparatus according to claim 15, wherein the memory cell forms part of a memory array, the memory array comprising a plurality of columns of memory cells and a plurality of rows of memory cells and wherein the memory cells in each column are connected via common bit-lines and the memory cells in each row are connected via common word-lines.

17. Apparatus according to claim 15, wherein the first semiconductor arrangement comprises a PMOS transistor.

18. Apparatus according to claim 15, wherein the first semiconductor arrangement comprises a pair of diodes.

19. Apparatus according to claim 15, wherein the testing circuitry comprises one of a low-threshold inverter and a Schmitt trigger connected to the first bit-line.

20. Apparatus according to claim 15, wherein the switching circuitry for connecting the first and second bit-lines to the low potential comprises a plurality of logic gates and a plurality of transistors.

21. Apparatus according to claim 15, wherein the apparatus is formed in an integrated circuit.

* * * * *